United States Patent
Maheshwari

(10) Patent No.: US 9,965,387 B1
(45) Date of Patent: May 8, 2018

(54) MEMORY DEVICES HAVING EMBEDDED HARDWARE ACCELERATION AND CORRESPONDING METHODS

(75) Inventor: Dinesh Maheshwari, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 1154 days.

(21) Appl. No.: 13/180,337

(22) Filed: Jul. 11, 2011

Related U.S. Application Data

(60) Provisional application No. 61/363,160, filed on Jul. 9, 2010.

(51) Int. Cl.
*G06F 12/06* (2006.01)
*G06F 13/16* (2006.01)

(52) U.S. Cl.
CPC ...... *G06F 12/0646* (2013.01); *G06F 13/1615* (2013.01)

(58) Field of Classification Search
CPC .... G06F 9/30101; G06F 12/0875; G06F 9/24; G06F 9/30145; G09G 2360/127; G09G 5/393; G09G 5/395
USPC ............... 711/104, 114, 144, 155, 157, 213; 712/10, 30, 34
See application file for complete search history.

(56) References Cited

U.S. PATENT DOCUMENTS

| | | | | |
|---|---|---|---|---|
| 5,388,239 A | * | 2/1995 | Iimura et al. | 711/220 |
| 6,735,611 B2 | * | 5/2004 | Vanstone | 708/492 |
| 6,742,098 B1 | * | 5/2004 | Halbert et al. | 711/172 |
| 7,240,145 B2 | * | 7/2007 | Holman | 711/5 |
| 7,571,300 B2 | * | 8/2009 | Wong | G06F 9/30014 712/1 |
| 7,610,423 B2 | * | 10/2009 | Gower et al. | 710/110 |
| 7,725,662 B2 | * | 5/2010 | Saha et al. | 711/145 |
| 2002/0174290 A1 | * | 11/2002 | Wu | G06F 13/4243 711/104 |
| 2007/0198519 A1 | * | 8/2007 | Dice | G06F 9/466 |
| 2007/0260841 A1 | * | 11/2007 | Hampel et al. | 711/167 |
| 2007/0288707 A1 | * | 12/2007 | Tremaine | G06F 13/1684 711/155 |
| 2009/0150624 A1 | * | 6/2009 | Resnick | G06F 9/3004 711/155 |

* cited by examiner

*Primary Examiner* — Zhuo Li

(57) ABSTRACT

A memory device can include an interface comprising a plurality of control and address connections and at least one set of data connections; memory circuits comprising a plurality of storage locations randomly accessible for read and write operations in response to an address value received on the address connections; and accelerator circuits coupled to the memory circuits and configured to perform at least one predetermined operation on data stored in the memory device to generate modified data for storage within the memory circuits in response to at least one command received on the interface; wherein the at least one command is supplemental to read and write commands executable by the memory device.

19 Claims, 25 Drawing Sheets

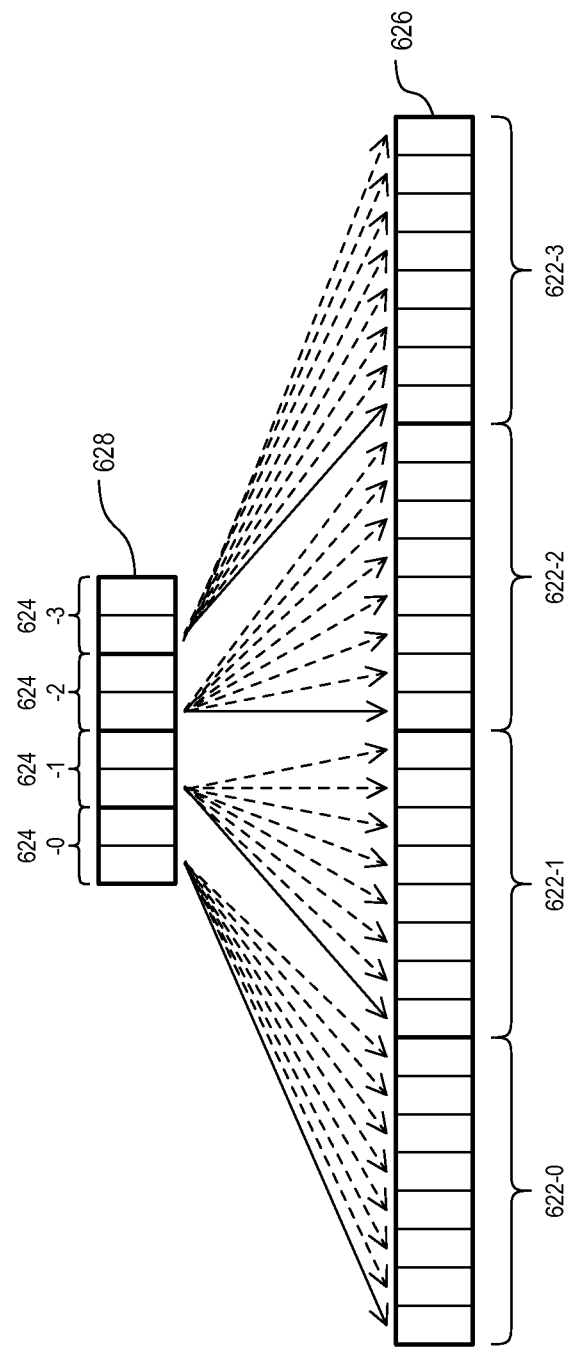

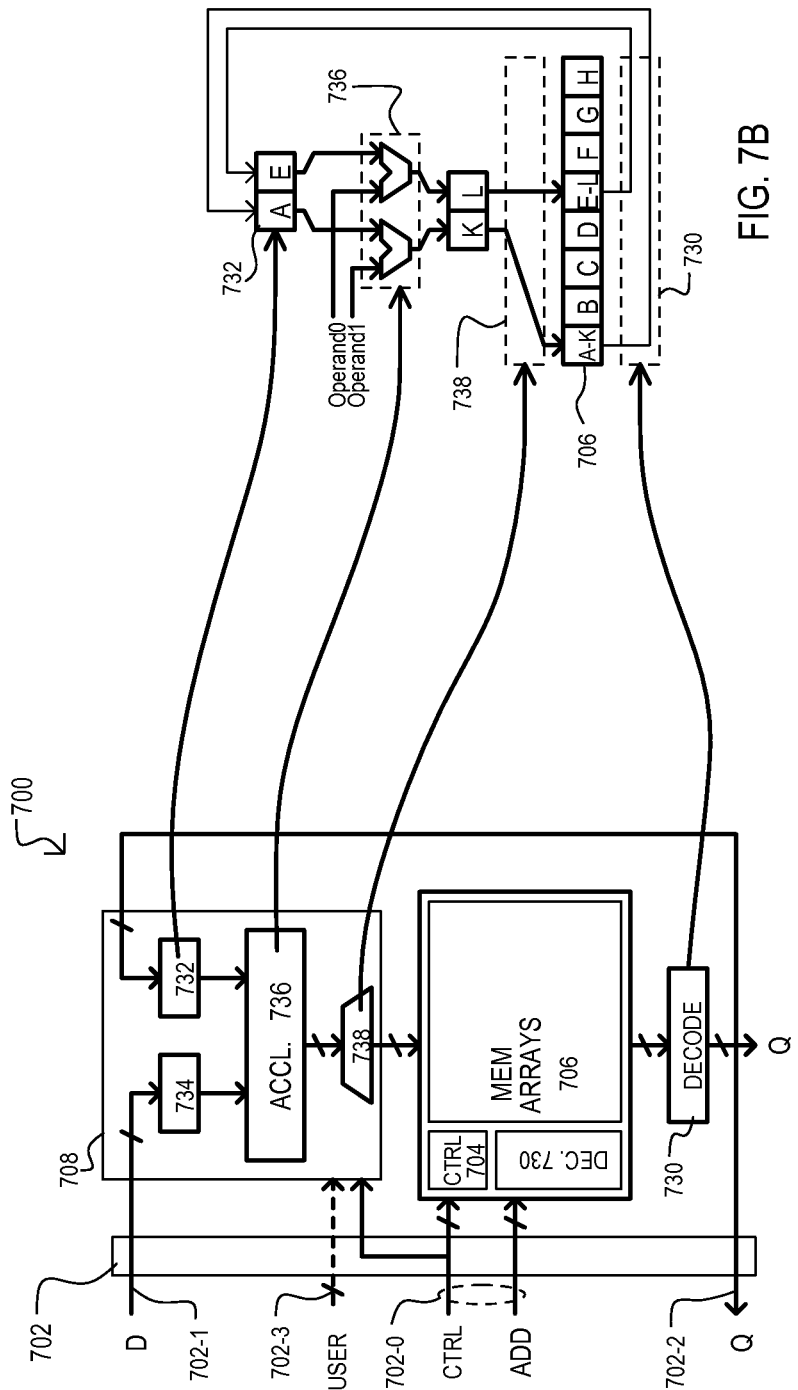

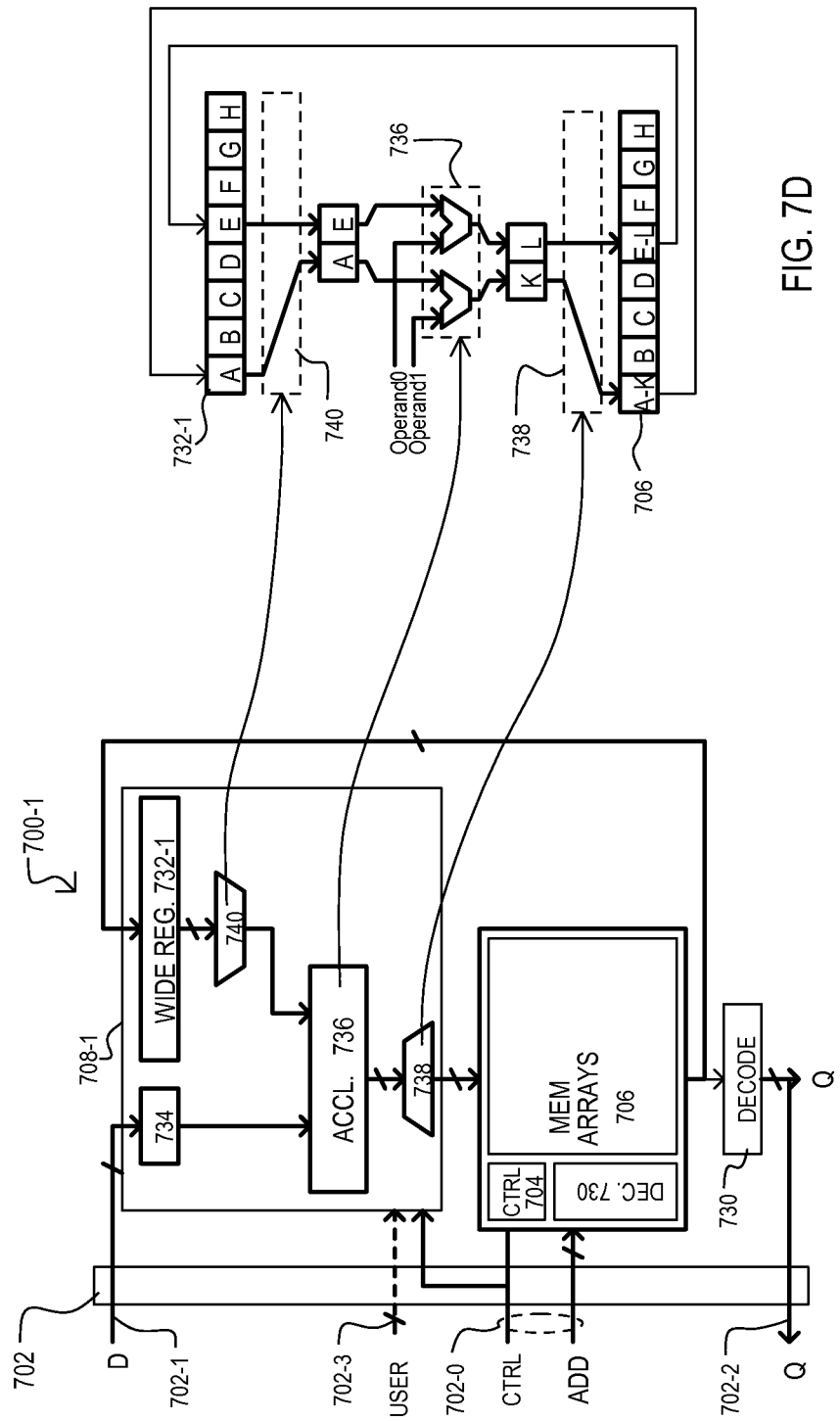

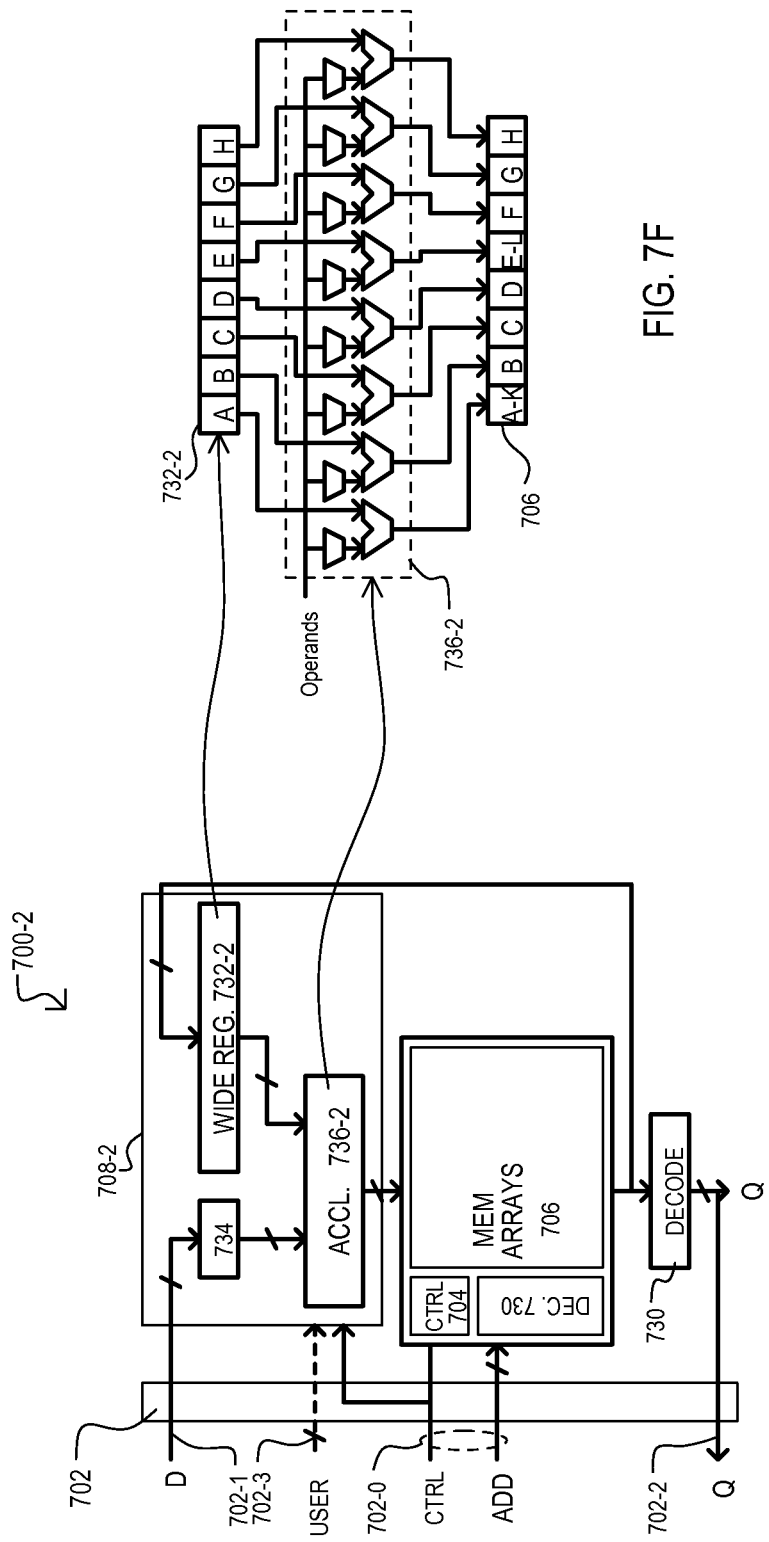

| Packet ID | Packet Location | | Status |
|---|---|---|---|
| Pkta | start ADD | end ADD | V |
| Pktb | start ADD | end ADD | V |
| ⋮ | | | |
| Pktk | start ADD | end ADD | V |
FIG. 12C
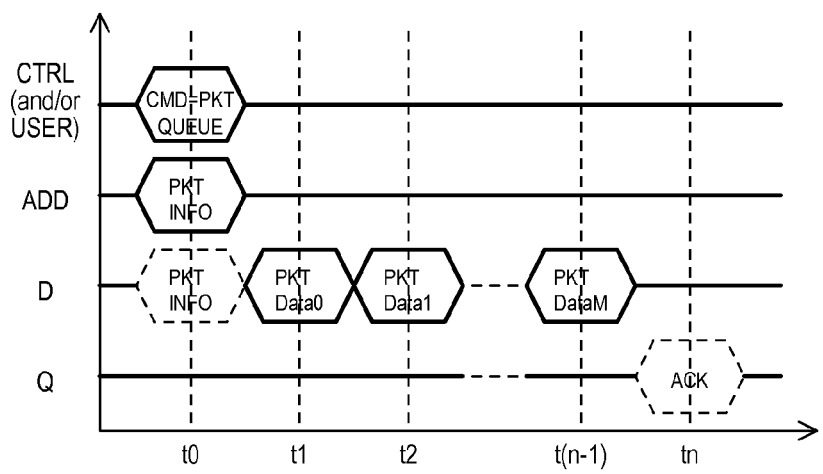
FIG. 12D
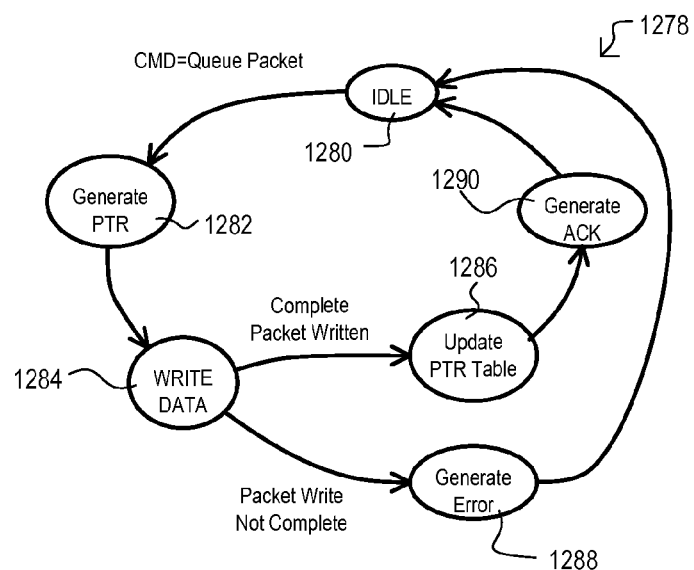
FIG. 12E

| /RPS | /WPS | User0 | User1 | User2 | |
|---|---|---|---|---|---|
| L | H | H | H | H | READ |
| H | L | H | H | H | WRITE |
| H | L | L | H | H | UPDATE VALUE |
| L | H | H | L | H | INC/DEC VALUE |
| L | H | L | L | H | ERROR CHECK |
| L | H | H | H | L | ECC GENERATION |
| H | L | L | H | L | HASH MATCH |
| H | L | H | L | L | TRIE |
| L | L | L | H | H | PACKET QUEUE |
| L | L | L | L | H | PACKET DE-QUEUE |

| CA0 /RAS | CA1 /CAS | CA2 /WE | CA3 | CA4 | CA5 | |
|---|---|---|---|---|---|---|
| L | L | H | H | H | H | READ |
| L | L | L | H | H | H | WRITE |
| L | L | L | L | H | H | UPDATE VALUE |
| L | H | H | H | L | H | INC/DEC VALUE |
| L | H | H | L | L | H | ERROR CHECK |
| L | H | H | H | H | L | ECC GENERATION |
| L | H | L | L | H | L | HASH MATCH |
| L | H | L | H | L | L | TRIE |
| L | H | L | L | L | H | PACKET QUEUE |
| L | H | L | L | L | H | PACKET DE-QUEUE |

| A20 | A19 | A18 | A17:A0 | |
|---|---|---|---|---|
| 0 | 0 | 0 | [accessed value] | STANDARD ACCESS |
| 1 | 0 | 0 | [accessed value] | SPECIAL OP - User Selected Operation, External Operand(s) |
| 1 | 0 | 1 | [accessed value] | SPECIAL OP - Preset Operation (no operand(s)) |
| 1 | 1 | 0 | [accessed value] | SPECIAL OP - Preset Operation, Preset Operand(s) |
| 1 | 1 | 1 | [accessed value] | SPECIAL OP - Preset Operation, External Operand(s) |
| 0 | 1 | 0 | [op control] | SPECIAL OP - No directly addressed data |

FIG. 15

MEMORY DEVICES HAVING EMBEDDED HARDWARE ACCELERATION AND CORRESPONDING METHODS

This application claims the benefit of U.S. provisional patent application Ser. No. 61/363,160 filed on Jul. 9, 2010, the contents of which are incorporated by reference herein.

TECHNICAL FIELD

The present disclosure relates generally to memory devices, and more particularly to memory devices having built-in circuits for operating on data stored within or received by the memory devices.

BRIEF DESCRIPTION OF THE DRAWINGS

FIG. 6 shows operations on selected data fields of a retrieved data value according to another embodiment.

FIGS. 7A and 7B show a memory device with built-in accelerator circuits that retrieve a portion of an addressable data value according to an embodiment.

FIGS. 7C and 7D show a memory device with built-in accelerator circuits that retrieve all of an addressable data value according to an embodiment.

FIGS. 7E and 7F show a memory device with built-in accelerator circuits that retrieve all of an addressable data value according to another embodiment.

FIGS. 12A to 12I show memory device packet queuing and de-queuing operations according to embodiments.

FIG. 15 shows memory device command formats that utilize address ranges according to another embodiment.

DETAILED DESCRIPTION

Figure 1:
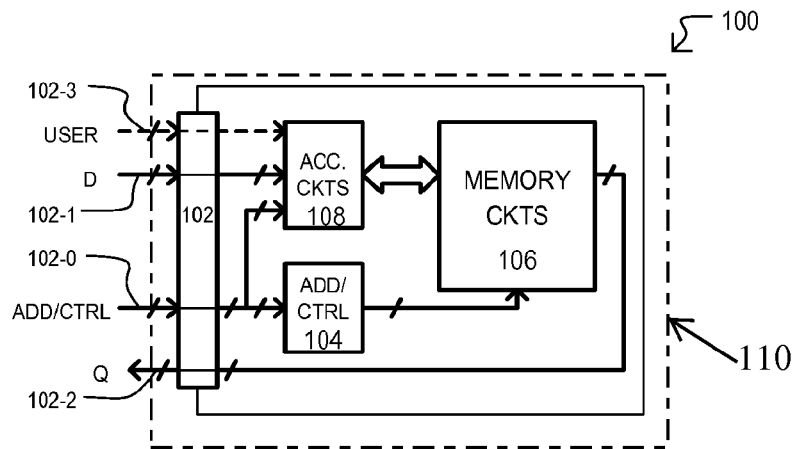
FIG. 1 is a block schematic diagram of an integrated circuit memory device according to a first embodiment.

Various embodiments will now be described that include memory devices, systems, and methods in which circuits are built into a memory device that perform functions on data, in addition to standard read and/or write operations. Such circuits can accelerate the performance of a system by executing operations in response to command requests from a processor, where such operations would otherwise require multiple memory accesses. In very particular embodiments, memory devices and systems may provide operations that assist in network data packet processing.

In the various embodiments shown herein, like sections may be referred to by the same reference characters, but with the leading digit(s) corresponding to the figure number.

Referring now to FIG. 1, a memory device according to one embodiment is shown in a block schematic diagram and designated by the general reference character 100. In the particular embodiment shown, a memory device 100 can perform operations in response to received commands. Such operations can include conventional memory accesses (e.g., random reads and writes). However, in addition, such operations can include special operations, including those that can modify stored data values without having to read such values to locations outside of the memory device.

A memory device 100 can include a memory interface (IF) 102, address/control (ADD/CTRL) circuits 104, memory circuits 106, and an accelerator section 108. Memory IF 102 can include conventional signal connections, including address and control connections 102-0 and data connections. In the particular embodiment shown, data connections include input data connections 102-1 (D) and output data connections 102-2 (Q). Optionally, an interface may also include user connections 102-3. Signal connections can be physical connections to memory device 100, including but not limited to any of integrated circuit (IC) "pads", or IC package bond wires, leads, pins, surface mount structures, grids, or balls.

In some embodiments, a memory interface 102 can have an interface compatible with existing memory devices. In one particular embodiment, a memory interface 102 may be a quad data rate interface, and address and control connections 102-0 can include a number of address connections according to a memory device storage capacity, as well as a read enable, write enable, and control clock inputs. Input and output data connections (102-1/2) can have a predetermined bit width (e.g., ×8, ×16, ×32 bits, or ×9, ×18, ×36 bits, with error correction).

In another particular embodiment, a memory interface 102 may be a double data rate DRAM type interface, and address and control connections 102-0 can include a number of address connections according to a memory device storage capacity, as well as a clock enable (CKE), chip select (CS), row address strobe (/RAS), column address strobe (/CAS), write enable (/WE) and a clock input. In such an embodiment, there may not be separate input data and output data connections, but rather bi-directional input/output data connections. Such input/output data connections can have a predetermined bit width like that noted for the quad data rate case.

Optional user connections 102-3 can be connections for providing additional data for use with special operations.

ADD/CTRL circuits 104 can receive signals on address and control connections 102-0, and can include command decoding and address decoding circuits for determining a type of requested command, and if appropriate, the address(es) targeted by the command. In some embodiments, ADD/CTRL circuits 104 can include conventional memory address and control circuit functions to enable conventional read and write operations in a random access fashion, including "burst" mode accesses. However, ADD/CTRL circuits 104 can also enable accesses to memory circuits 106 in combination with accelerator section 108 to execute commands in addition to conventional read/write accesses. Examples of such additional commands and functions are described in more detail below.

In alternate embodiments, ADD/CTRL circuits 104 can receive signals on USER connections 102-3, which can indicate a command corresponding to a specialized operation.

Memory circuits 106 can include a number of storage locations formed by multiple memory cells. In some embodiments, memory circuits 106 can include multiple memory cell arrays. In particular embodiments, such memory cells can include static random access memory (SRAM) type cells. SRAM cells can be advantageously fast for network memory applications, as will be described in more detail below. In other particular embodiments, such memory cells can include dynamic RAM (DRAM) type cells, including "pseudo" SRAM type architectures.

Accelerator section 108 can include circuits for executing one or more specialized operations for data stored in memory circuits 106 in response to one or more received commands. Specialized operations can include data modifying operations and/or data access operations. Data modifying operations can access one or more stored data values from memory circuits 106, modify such values, and then store them back in memory circuits 106. Such modification can utilize one or more operands provided in conjunction with a command, or may not rely on an externally provided operand. Data access operations can include read and/or write operations for variable data lengths well in excess of conventional burst operations, enabling data packets (which have sizes that can vary) to be queued in, and de-queued from, memory circuits 106. Accelerator section 108 can include any of: arithmetic-logic circuits, comparator circuits, and state machines for enabling conditional accesses to memory circuits 106. Accelerator section 108 can increase the rate at which random memory transactions are completed, as a processor can accomplish data manipulation with specialized instructions issued to memory device 100 that can reduce or eliminate the need to transmit data between the processor and memory device 100.

In the embodiment of FIG. 1, memory IF 102, ADD/CTRL circuits 104, memory circuits 106, and accelerator section 108 can all form part of a same IC device 110. In some embodiments, an IC device 110 can be a single IC (e.g., die or packaged die). However, in other embodiments, an IC device 110 can be an IC package containing two or more ICs (e.g., a multi-chip module).

Figure 2:
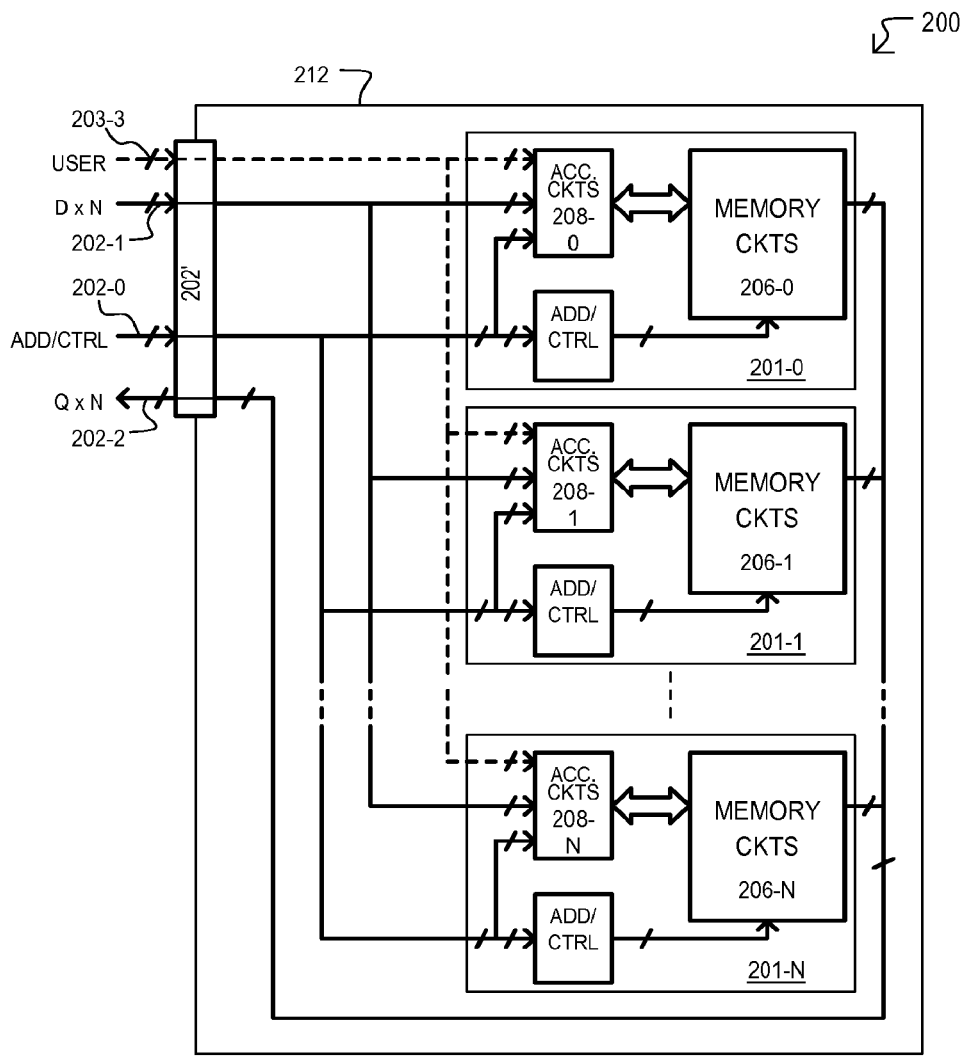
FIG. 2 is a block schematic diagram of a memory module device according to an embodiment.

FIG. 2 shows a memory device 200 according to another embodiment. Memory device 200 can include multiple memory IC devices 201-0 to 201-N, each of which can have a structure like that of FIG. 1. That is, each memory IC device (201-0 to -N) can have a built-in accelerator section (208-0 to -N, respectively).

Memory devices (201-0 to -N) can be commonly connected to a same memory interface 202'. Memory interface 202' can include address and control connections 202-0, input data connections 202-1 (D), output data connections 202-2 (Q), and optionally user connections 202-3. In one embodiment, such connections (202-0 to 202-3) can be circuit board leads. In the particular embodiment shown, each memory device (201-0 to -N) can have data widths (e.g., bit widths) of "D" and "Q" (where D and Q can be the same), and memory interface 202' can provide data paths for such multiple memory devices in parallel. Thus, memory interface 202' is shown to have D×N input data connections 202-1 and Q×N output data connections 202-2.

In the embodiment of FIG. 2, memory devices (201-0 to -N) can form part of a same memory module 212. In a very particular embodiment, a memory module 212 can include a circuit board upon which memory devices (201-0 to -N) are mounted, and interconnected with one another by circuit board traces.

Figure 3:
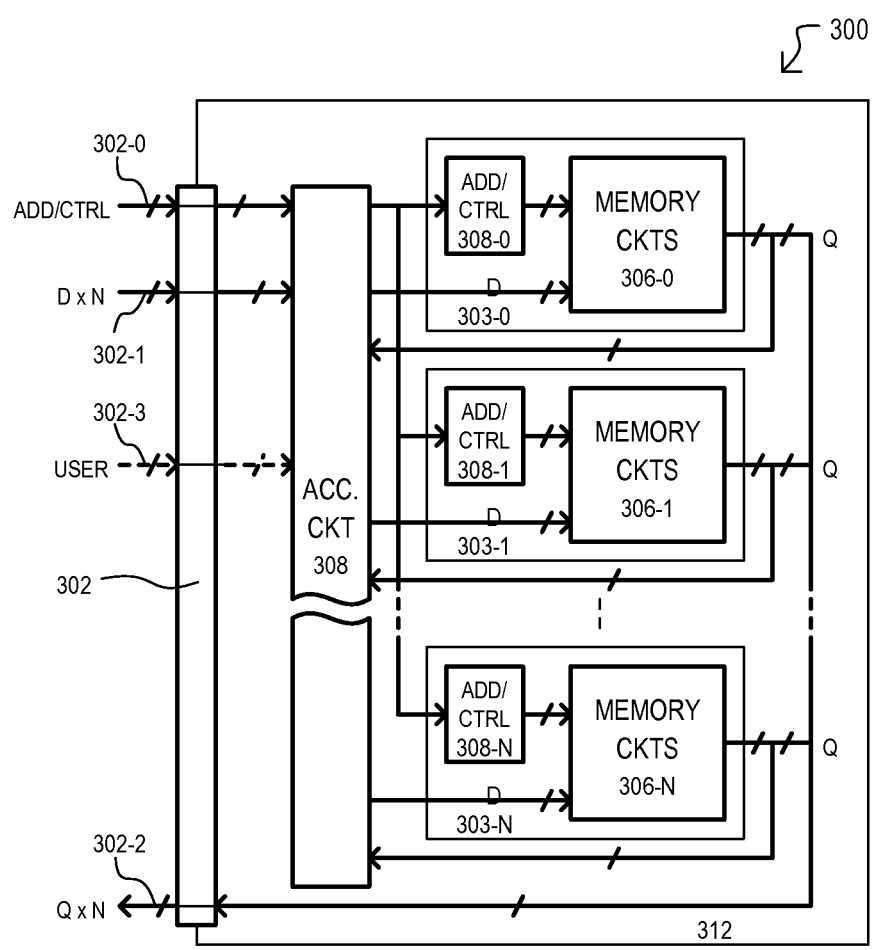
FIG. 3 is a block schematic diagram of a memory module device according to another embodiment.

FIG. 3 shows a memory device 300 according to another embodiment. Memory device 300 can include multiple memory IC devices 303-0 to 303-N as in the case of FIG. 2. However, unlike FIG. 2, memory IC devices (303-0 to -N) may not include built-in accelerator sections on the same IC device. Instead, accelerator sections 308 for memory IC devices (303-0 to 303-N) can be formed external to memory IC devices (303-0 to -N).

Accelerator sections 308 can execute operations on memory locations within memory IC devices (303-0 to -N) individually and/or collectively. In conventional access commands (e.g., read/writes), all, or a portion of, signals received on connections (302-0/1) can be applied to memory IC devices (303-0 to -N) unchanged, or substantially unchanged. However, in response to special commands, accelerator circuits 308 can generate control signals, addresses, data, and sequences thereof, to enable special operations, as will be described in more detail below.

In the embodiment of FIG. 3, memory devices (303-0 to -N) and accelerator circuits 308 can form part of a same memory module 312, like that of FIG. 2. That is, a memory module 312 can include a circuit board upon which memory devices (303-0 to -N) and accelerator circuits 308 are mounted, and interconnected with one another by circuit board traces.

Referring now to FIGS. 4A to 4E, examples of instructions that can be provided to, and executed by, memory devices and systems, are shown in a series of diagrams. In FIGS. 4A to 4F, all instructions can include a control field 414, an address field 416, an input data field 418, and optionally, a user field 420. In particular embodiments, a control field 414 represents signals driven on control connections of a memory device. Similarly, an address field 416 can represent signals driven on address connections of a memory device, while an input data field 418 can include bit values for signals driven on input data connections (or on input/output data connections, in the event the memory device has a bi-directional data bus).

Figure 4A:
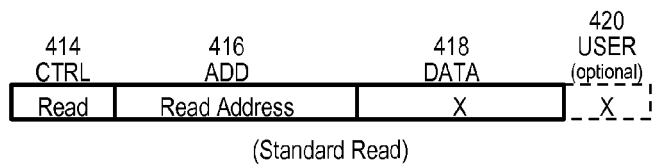
FIGS. 4A and 4B show conventional memory device instructions.

FIG. 4A shows a conventional read instruction. A control field 414 can include values that indicate a read operation and an address field 416 includes a read address to be accessed. Both an input data field 418 and a user field 420 may not be used.

Figure 4B:
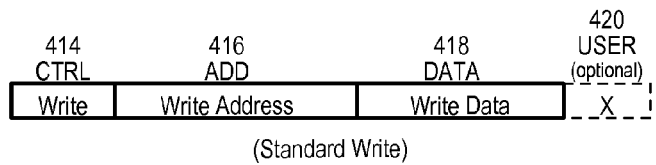

FIG. 4B shows a conventional write instruction. A control field 414 can include values that indicate a write operation and an address field 416 includes a write address to be accessed. A data field 418 can contain write data to be written at the address. A user field 420 may not be used.

Figure 4C:
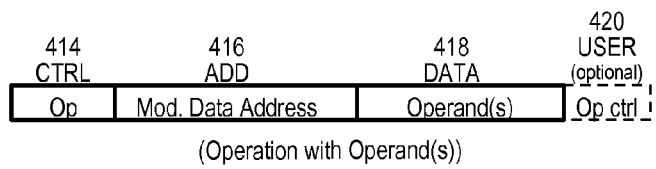
FIGS. 4C to 4F show memory device instructions according to embodiments.
Figure 4D:
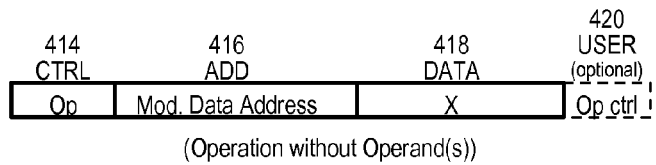
Figure 4E:
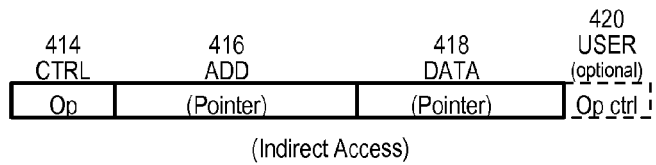

FIGS. 4C to 4E show how special instructions can utilize the same format as conventional instructions shown in FIGS. 4A and 4B.

FIG. 4C shows an "Operation with Operand(s))" instruction. In response to such an instruction, an operation can perform an arithmetic-logic operation on all, or a portion of, a data value already stored within a memory device. A control field 414 can include values that indicate a special operation (Op00). In some embodiments, unused combinations of control signals (i.e., control signal combinations that are reserved or invalid with respect to a conventional memory device) can be used to signify such an operation. Alternatively, a user field 420 alone, or in combination with a control field 414, can indicate the special operation. An address field 416 can indicate where the value to be modified is stored. An input data field 418 can include one or more operands used to modify a stored data value. A user field 420 may also provide all or a portion of operand(s).

FIG. 4D shows an "Operation without Operand(s))" instruction. In response to such an instruction (Op01), an operation can be performed on all, or a portion of, a data value already stored within a memory device. The various fields can include values as noted in FIG. 4C. However, an input data field 418 may not be used, as an operand is not needed.

FIG. 4E shows an "Indirect Access" instruction. In response to such an instruction, an operation can access one or more physical locations within the memory device in response to a value that is not a physical address. A control field 414 can serve the same purpose as FIGS. 4C/D, indicating the operation to be performed. However, unlike FIGS. 4C/D, any of address field 416, input data field 418, or user field 420 can store all or a potion of a "pointer" value. A pointer value can be processed by the memory to access one or a group of addresses for a particular operation. That is, such an operation can translate a logical value to into a physical address, or set of physical addresses.

Figure 4F:
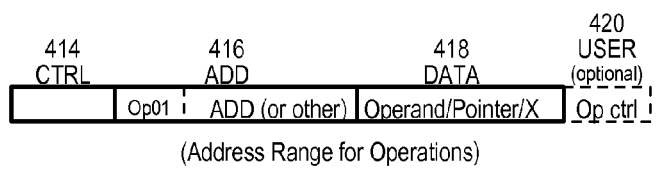

FIG. 4F shows an "Address Range for Operation" instruction. In response to such an instruction, a memory device can examine address values to determine a type of special operation to be performed. Thus, a portion of address field 416 can include operation data (Op01). A remaining portion of an address field 416 can include an address or data for use with the special operation.

As noted above, a memory device according to embodiments can perform an operation on one or more portions of a stored data value. In some embodiments, operations can be configured to align along predetermined divisions of a stored data value, such as byte slices, as but one example.

Figure 5A:
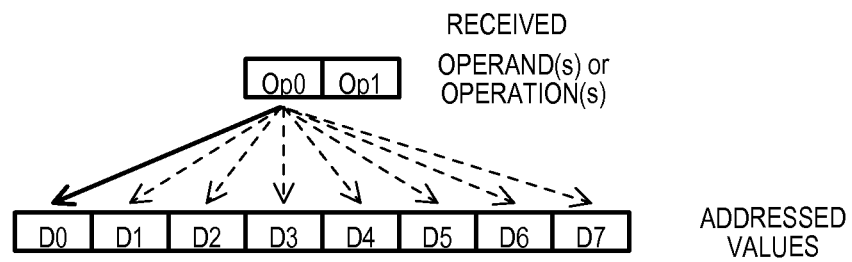
FIGS. 5A to 5C show operations on selected data fields of a retrieved data value according to embodiments.
Figure 5B:
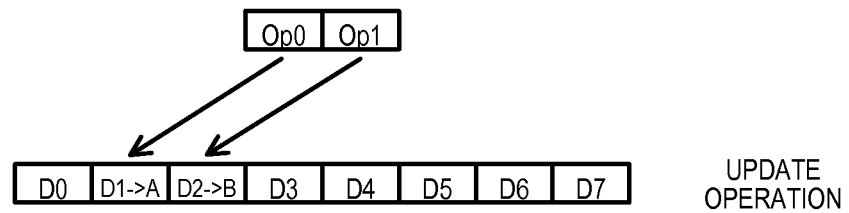
Figure 5C:
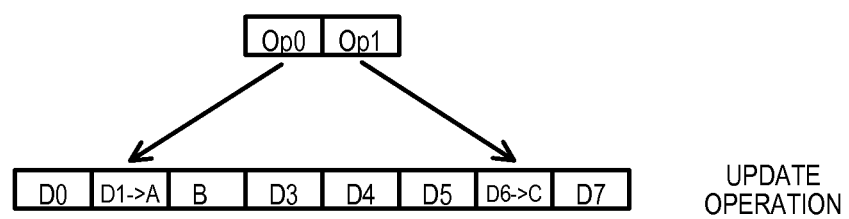

FIGS. 5A to 5C are diagrams showing how operations can be aligned along divisions of a retrieved memory device according to an embodiment. FIG. 5A shows an addressed value (D0 to D7) as well as two operations (represented by Op0 and Op1). Values D0-D7 represent divisions (e.g., bit slices of equal size, such as bytes) of an addressed value, and can include, but are not limited to, bytes, words, double words, etc. An addressed value (D0-D7) can represent how much of a stored data value can be accessed by a memory device. In some embodiments, an operation may retrieve all of an addressed value. However, in alternate embodiments, an operation may retrieve only a portion of an addressed value (e.g., those portions being operated on).

Operations (Op0/1), as noted above, may or may not utilize an operand to modify addressed value D0 to D7. Further, such operations may be different from one another. In the embodiment shown, operations (Op0/1) can be aligned along bit divisions.

FIG. 5A shows how an operation can be applied to any of multiple portions of an addressed value. In the very particular example shown, an operation Op0 can be applied to any of bit divisions D0 to D7. Similarly, an operation Op0 can be applied to any of bit divisions D1 to D7.

FIG. 5B shows one very particular example in which an operation can occur on adjacent bit divisions. Operation Op0 can be applied to bit division D1, and can change such a value to A. Similarly, operation Op1 can be applied to bit division D2, and can change such a value to B.

FIG. 5C shows one very particular example in which an operation can occur on non-adjacent bit divisions. Operation Op0 can be applied to bit division D1, and can change such a value to A. Operation Op1 can be applied to bit division D6, and can change such a value to C.

How particular operations are aligned with bit divisions can be established upon power-up of a device and/or in response to instruction data provided with an instruction, as but a few examples.

While FIGS. 5A to 5C show two operations that may be applied to any two of eight divisions, alternate embodiments can include a smaller or larger ratio between applied operations and divisions of a data value. FIG. 6 shows one example of such an embodiment.

FIG. 6 shows an addressable data value 626 and operations 628 that can be applied to such a value. Addressable value 626 can include four sections 622-0 to -3, each of 8 bytes. Operations 628 include four operation groups 624-0 to -3. Each operation groups (624-0 to -3) can perform two eight bit operations on any two bits of one section 622-0 to -3. Thus, there can be 16 bits of a dynamic operation (which may or may not involve an operand) for every 64-bits of an internal data value.

FIGS. 7A and 7B show a memory device an operation according to particular embodiments. FIGS. 7A and 7B show a memory device in which a portion of an addressable value can be retrieved and operated on. FIG. 7A is a block schematic diagram of a memory device. FIG. 7B is a diagram showing data and operations performed by the memory device of FIG. 7A.

FIG. 7A shows a memory device 700 that can include a memory I/F 702, control circuits 704, decoder circuits 730, memory circuits 706, and an accelerator section 708. In the embodiment shown, an interface 702 can have separate input and output data paths. Control circuits 704 can control operations that access memory circuits 706 including operations within accelerator section 708. Memory circuits 706 can include memory arrays that enable random access to storage locations. Such accesses may or may not include burst accesses.

Accelerator section 708 can include a retrieved data latch 732, an input data latch 734, accelerator circuits 736, and remapping circuit 738. Retrieved data latch 732 can store a data value retrieved from memory circuits 706 in response to one or more received instructions. In the particular embodiment shown, retrieved data latch 732 can be narrower (store fewer bits) than a size of data values accessible by an address (e.g., retrieved data latch 732 can be 16-bits wide, while 64-bits of data may be accessible with an address).

An input data latch 734 can store data values received on input data connections 702-1, which can include operands. In some embodiments, input data latch 734 can also store write data for conventional write operations.

Accelerator circuits 736 can perform one or more operations on retrieved data stored in retrieved data latch 732 to create modified data to be written into memory circuits 706. As will be shown in more detail below, accelerator circuits 736 may or may not utilize operands to generate modified data. A type of operation performed by accelerator circuits 736 can be established upon startup of memory device 700, in response to control signals CTRL, or in response to user values USER, or combinations thereof.

In the embodiment shown, remapping circuit 738 can apply modified data values generated by accelerator circuits 736 for storage within memory circuits 706.

FIG. 7B shows one example of an operation by memory device 700 according to an embodiment. In response to one or more instructions and one or more addresses, a data values stored in memory circuits 706 can be accessed. In the embodiment shown, such a memory value can include eight fields storing data values shown as A, B, C, D, E, F, G, and H. In a very particular embodiment, each field can be a byte.

By operation of a decoder circuit 730 a portion of the accessed data value can be retrieved and stored in retrieved data latch 732. In the embodiment shown, data values A and E are retrieved. Which fields are selected for modification can be established upon start-up of a device, in response to control signals CTRL, or in response to user values USER, or combinations thereof.

By operation of accelerator circuits 736, retrieved data portions can be operated on to generate modified data values K, L. As noted above, depending upon the type of operation, operands may, or may not, be used to generate modified data values K, L.

By operation of remapping circuits 738, modified data values K and L can be written into the data fields previously occupied by data values A and E, respectively. Which fields are selected for writing of modified data can be established upon start-up of a device, in response to control signals CTRL, or in response to user values USER, or combinations thereof.

In this way, a memory device can retrieve a portion of an addressable data value for modification in response to one or more commands.

FIGS. 7C and 7D show a memory device according to another embodiment. FIGS. 7C and 7D show a memory device in which all of an addressable value can be retrieved, with portions of the retrieved data value being operated on. FIG. 7C is a block schematic diagram of a memory device. FIG. 7D is a diagram showing data and operations performed by the memory device of FIG. 7C.

Memory device 700-1 of FIG. 7C can include sections like those of FIG. 7A, thus a description of such like sections will be omitted. Memory device 700-1 can differ from that of FIG. 7A in that a retrieved data latch 732-1 can have a "native" width (i.e., a same bit width as data values accessible by an address). In addition, accelerator section 708-1 can include data selector 740, which can select particular fields from a retrieved data value stored in retrieved data latch 732-1.

FIG. 7D shows a same operation result as FIG. 7B. FIG. 7D differs from FIG. 7B in that a data selector 740 can select a portion of the retrieved data value stored within retrieved data latch 732-1 for application to accelerator circuits 736. In the embodiment shown, data values A and E are selected. Which fields of a retrieved data value are selected by a data selector 740 can be established upon start-up of a device, in response to control signals CTRL, or in response to user values USER, or combinations thereof.

In this way, a memory device can retrieve all of an addressable data value for modification in response to one or more commands.

FIGS. 7E and 7F show a memory device according to a further embodiment. FIGS. 7E and 7F show a memory device in which all of an addressable value can be retrieved and operated on. FIG. 7E is a block schematic diagram of a memory device. FIG. 7F is a diagram showing data and operations performed by the memory device of FIG. 7E.

Memory device 700-2 of FIG. 7E can include sections like those of FIG. 7C, thus a description such like sections will be omitted. Memory device 700-2 can differ from that of FIG. 7C in that accelerator circuits 736-2 can operate on any or all portions of a retrieved data value of native width.

FIG. 7F shows a same operation result as FIGS. 7B and 7D. FIG. 7F differs from FIG. 7D in that accelerator circuits 736-2 can operate on any or all of a retrieved data portion.

Which fields are selected by data selector can be established upon start-up of a device, in response to control signals CTRL, or in response to user values USER, or combinations thereof.

In this way, a memory device can retrieve all of an addressable data value, for modification of all or a portion of such a retrieved data value, in response to one or more commands.

Figure 8A:
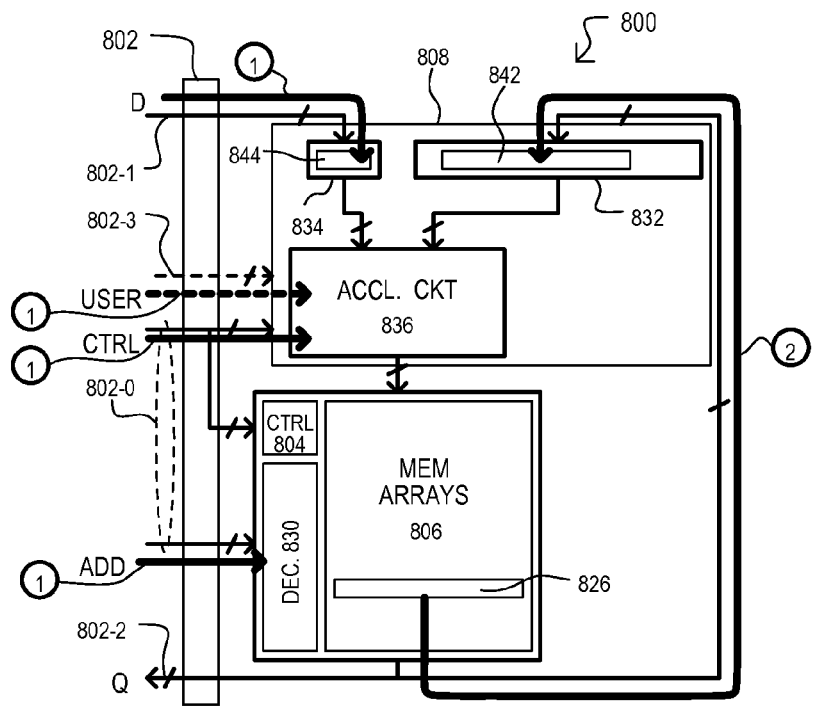
FIGS. 8A to 8D show memory device update operations that update a stored data value according to embodiments.
Figure 8B:
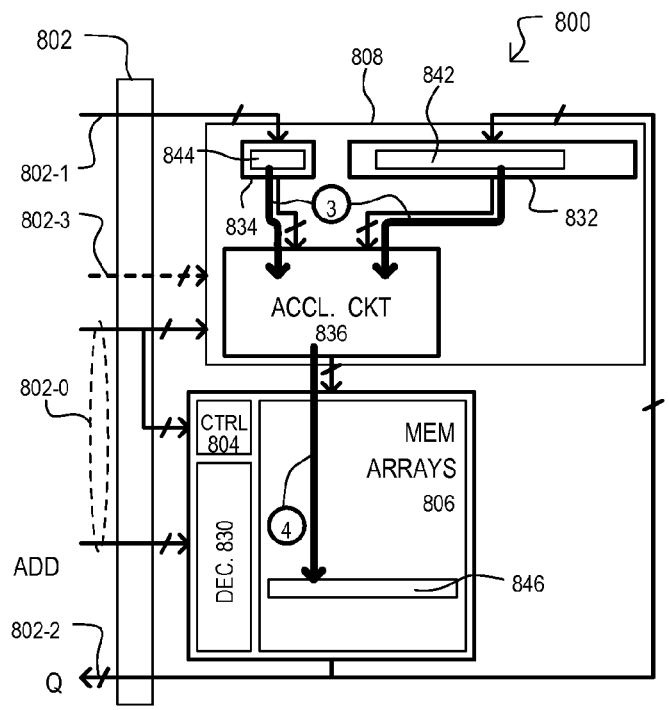

Referring to FIGS. 8A and 8B, a memory device and operation are shown in a sequence of block schematic diagrams. FIGS. 8A and 8B show a response to an "operation with operand" type instruction. A memory device 800 can include sections those shown in FIGS. 7A to 7F, and like sections are referred to by the same reference character but with the first digit being an "8" instead of a "7".

FIG. 8A shows the reception of instruction data and an initial response of memory device 800. In the particular embodiment shown, one or more operands 844 can be received on data connections 802-1 and stored within input data latch 834. At the same time, control and address values can be received on control/address connections 802-0. Optionally, user input values can also be received on user connections 802-3. In one embodiment, such actions can occur substantially simultaneously, as shown by the bold lines designated by the circled number 1.

In response to control/user values (CTRL/USER) and address values (ADD), all or a portion of an addressable data value 826 within memory circuits 806 can be retrieved and stored as retrieved data 842 within retrieved data latch 832. Such actions can occur after the reception control and address data, as shown by the bold line designated by the circled number 2. As understood from the embodiments disclosed herein, retrieved data 842 can be the same as an addressable data value 826, or can be selected portions of such a value.

FIG. 8B shows the modification of retrieved data by memory device 800 in response to the instruction and data values shown in FIG. 8A. In the particular embodiment shown, received operand(s) 844 can be applied to accelerator circuits 836 along with retrieved data 842. Such actions are shown by bold lines designated by the circle number 3. Accelerator circuits 836 can perform arithmetic/logic or other operations on retrieved data 842 to generate modified data 846. Such modified data can be written back into memory circuits 806. Such actions are shown by bold lines designated by the circle number 4.

In this way, a memory device can perform operations on retrieved data using one or more operands received with instruction data.

Figure 8C:
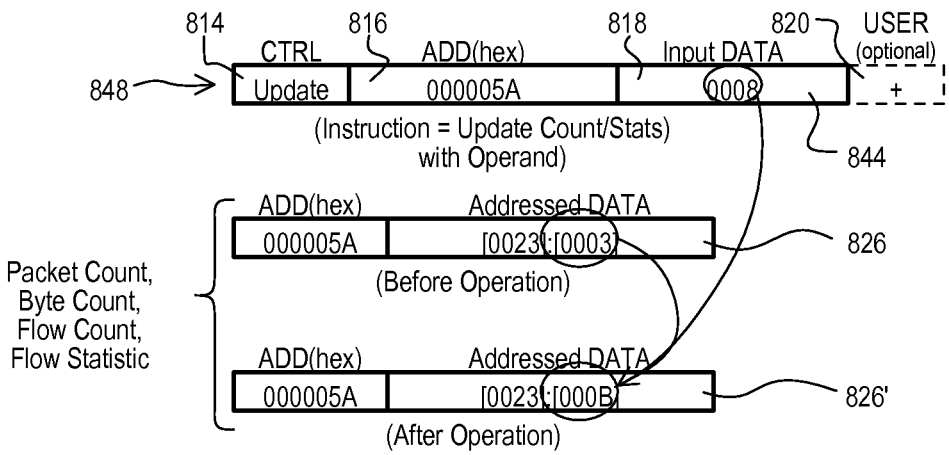

FIG. 8C shows one particular example of received instruction data 848 and corresponding addressable data 826/826'. A control field 814 can indicates an update instruction that can update a data field with a provided operand. It is noted that such an instruction is different than a read or write instruction conventionally executable by a memory device. An address field 816 can indicate an address of a storage location containing all, or a portion of, a stored data value to be updated. In the embodiment shown, the address is "000005A" (hex). An input data field 818 can include a value to add to a currently stored value, which in the embodiment shown is "8". In the particular embodiment shown, optional user field 820 can indicate a type of function performed, which in the embodiment shown can be an addition operation (+).

Addressable data 826 shows a data value before the instruction 848 is executed by a memory device. As shown, at address 000005A, stored data can include two different fields, one storing 0023(hex), the other storing 0003(hex). In the embodiment shown, the latter is updated according to the instruction data 848.

Addressable data 826' shows a data value after instruction 848 is executed by a memory device. As shown, at address 000005A, the second data field now stores 000B(hex), reflecting the addition of provided operand.

It is noted that such a modification of a data value does not require a data value to be read to the instruction-issuing device. Thus, reducing transactions in the system as compared to conventional approaches that would read the data value to a processor, modify the data value, and then write the modified data value back into the memory location.

Figure 8D:
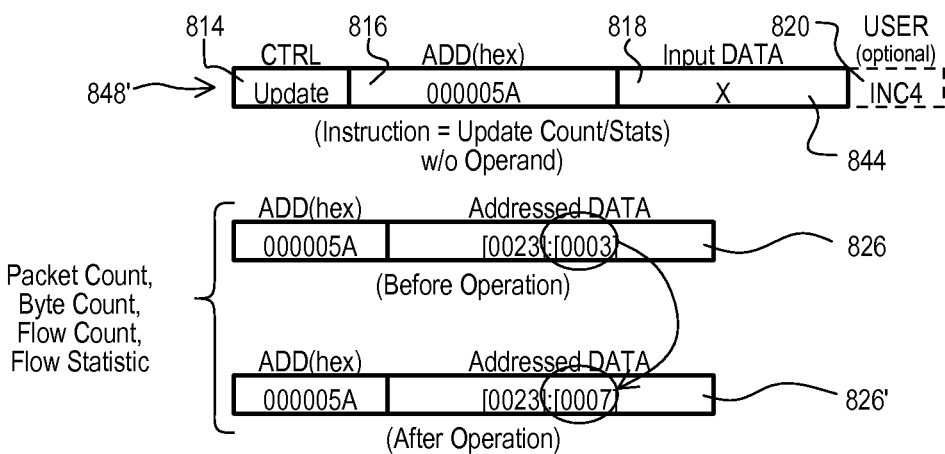

As noted above, while instructions can include operands, other operations may not include operands. One example of such an instruction is shown in FIG. 8D. FIG. 8D includes items like those of FIG. 8C, and such items are understood with reference to FIG. 8C.

FIG. 8D differ from FIG. 8C in that instruction 848' can include a control field 814 having an instruction indicating an update without an operand. Accordingly, an input data field 818 does not include valid data. In the particular embodiment shown, optional user field 820 can indicate a type of function performed, which in the embodiment shown can be an increment-by-4 function (INC4).

Addressable data 826 shows a data value before the instruction 848' is executed that is the same as FIG. 8C.

Addressable data 826' shows a data value after instruction 848' is executed by a memory device. As shown, at address 000005A, the second data field now stores 0007(hex), reflecting the previously value 0003 has been incremented by 4.

As shown in FIGS. 8C and 8D, the noted instructions can be utilized to update values associated with network processing, including but not limited to packet counts, byte counts (for packets, flow, queues, etc.), flow counts (number of flows, number of packets per flow, etc.) or other flow statistics. Such instructions can enable fast updates for values without involving multiple accesses by a processor device.

While memory devices can perform operations with operands provided on input data connections, in addition or alternatively, embodiments can also utilize operands included as part of a retrieved data value. One such embodiment is shown in FIGS. 9A and 9B.

Figure 9A:
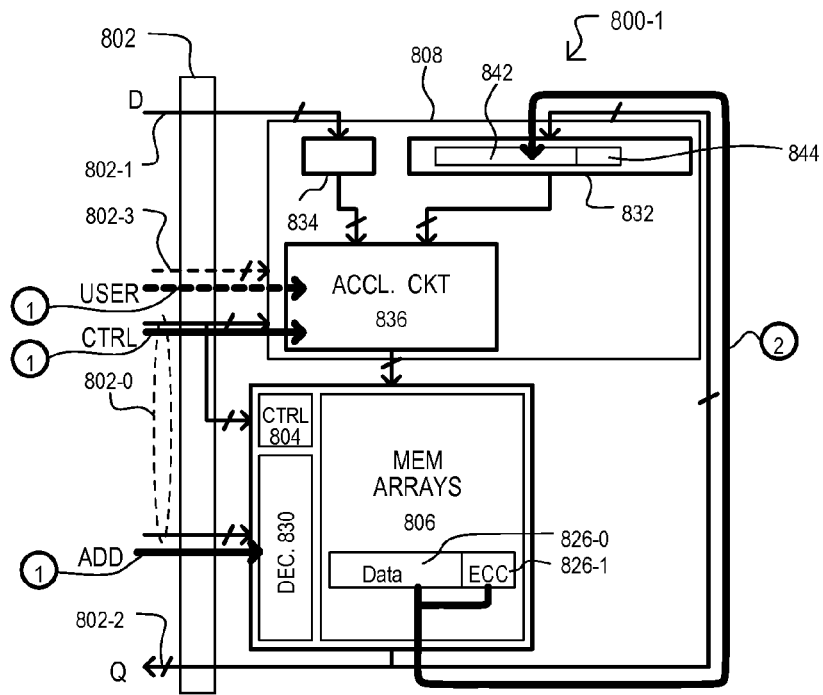
FIGS. 9A to 9D show memory device error code operations according to embodiments.
Figure 9B:
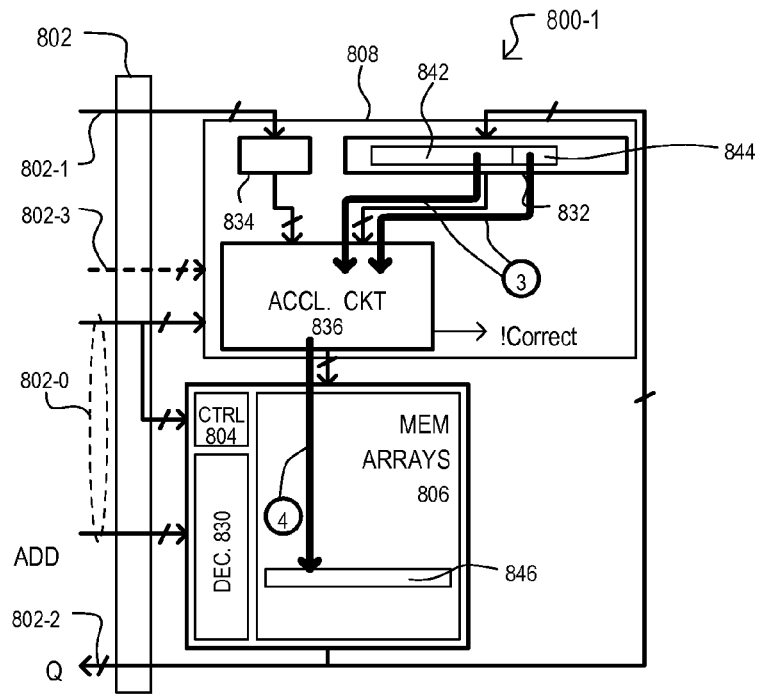

FIGS. 9A and 9B show a memory device and operations in a sequence of block schematic diagrams. FIGS. 9A and 9B show a response to an "operation with embedded operand" type instruction. In the particular embodiment of FIGS. 9A and 9B, an error check (and optionally error correction) operation can be performed on a data value stored within memory circuits 806. A memory device 800-1 can include sections those shown in FIGS. 8A and 8B, and like sections are referred to by the same reference character.

FIG. 9A shows the reception of instruction data, and the initial response of memory device 800-1. Unlike FIG. 8A, in FIG. 9A no operand data is received via data connections 802-1. In response to control/user values (CTRL/USER) and address values (ADD), a portion of an addressable data value 826 within memory circuits 806 can be retrieved as a data value "to be checked" (Data). Stored with the data value can be an error check code (or optionally an error check and correction code) (ECC) corresponding to data to be checked (Data). Such actions can occur after the reception control and address data, as shown by the bold line designated by the circled number 2. FIG. 9B shows an error check (and optionally error correction) operation performed by memory device 800-1. In response to the instruction values shown in FIG. 9A, a retrieved data value 842 can be applied to accelerator circuits 836 along with the ECC value, which can be conceptualized as an operand 844. Such actions are shown by bold lines designated by the circle number 3. Accelerator circuits 836 can perform at least an error check on the data (Data, 842) utilizing ECC 844. As but one very particular embodiment, accelerator circuits 836 can generate an ECC value for received data, and compare such a value to a received ECC value (i.e., 844). If checked data is determined to not include errors, no action may be taken, or a memory device 800-1 can generate an indication (!Correct) that signifies no error. Optionally, data and/or its corresponding ECC code can be re-written back into memory circuits 806. If checked data is determined to include an error, a memory device 800-1 can generate an error indication (!Correct). Such an indication may be output from memory device 800-1 to a device (e.g., processor not shown) issuing the instruction. In one embodiment, such an indication can be provided on output data connections 802-2 or on other output connections (not shown).

In some embodiments, accelerator circuits 836 may also include error correction capabilities. As but one very particular embodiment, accelerator circuits 836 can generate an ECC value (where such value is an error check and correction value) for received data, and compare such a value to a received ECC value (i.e., 844). If checked data is determined to include errors, accelerator circuits 836 can utilize the received ECC value to correct the data value. Corrected data may then be re-written back into memory circuits 806 with the corresponding ECC value. If an error is not correctable, a memory device 800-1 can generate an error indication (!Correct). Such an indication may be output to device issuing the instruction as noted above.

In one very particular embodiment, accelerator circuits 836 can include circuits that utilize an error code (ECC) to provide for single error correction and double error detection (SEC-DED) type error correction.

Figure 9C:
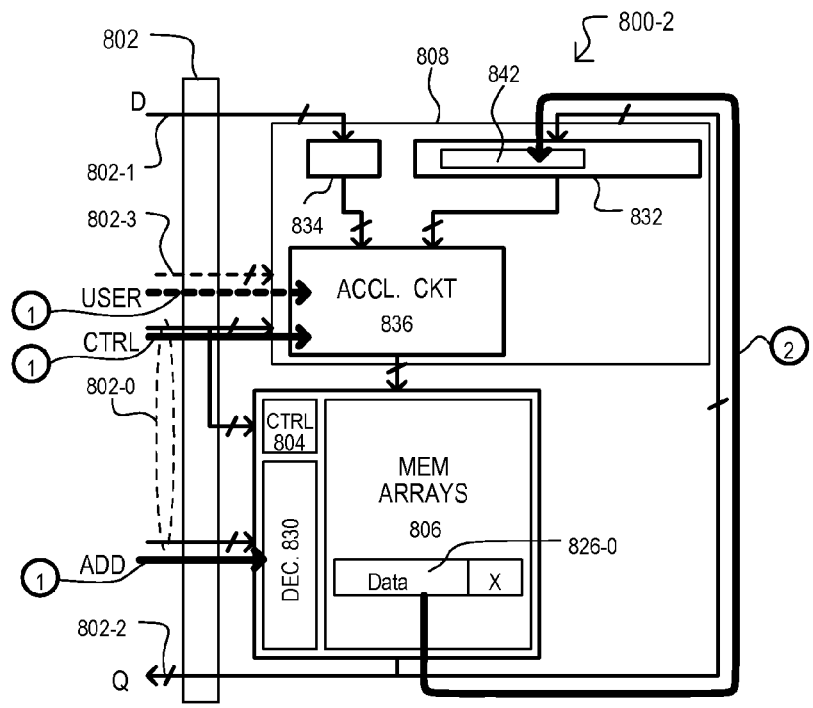
Figure 9D:
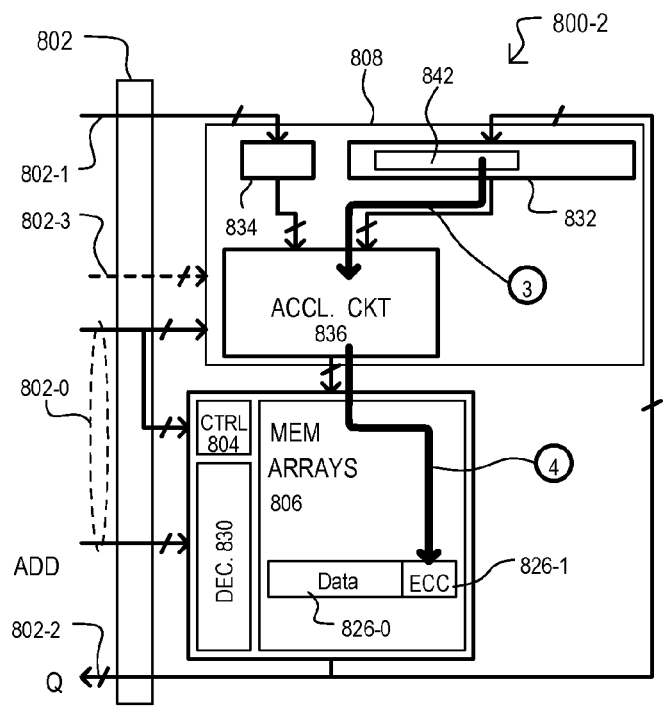

Referring now to FIGS. 9C and 9D, another operation without an operand according to an embodiment is shown in a series of block diagrams. In the particular embodiment of FIGS. 9C and 9D, an error code generation operation can be performed on a data value stored within memory circuits 806. A memory device 800-2 can include sections those shown in FIGS. 9A and 9B, and like sections are referred to by the same reference character. In some embodiments, memory device 800-2 can be the same as FIGS. 9A and 9B.

FIG. 9C shows the reception of instruction data, and the initial response of memory device 800-2. It is noted that the error code generation operation can be performed in response to an instruction, which differs from a conventional read and write instruction. In that way, the error code generation operation can be different from conventional "built-in" error code generation circuits that automatically generate an error code as data is written into memory circuits.

In FIG. 9C, in response to control values (CTRL) and address values (ADD), a data value 826-0 within memory circuits 806 can be retrieved as a data value (Data) for which an error code will be generated. Such a data value can be retrieved and stored in retrieved data register 832. Such actions can occur after the reception control and address data, as shown by the bold line designated by the circled number 2.

FIG. 9D shows an error code generation operation performed by memory device 800-2. A retrieved data value 842 can be applied to accelerator circuits 836. Such actions are shown by the bold line designated by the circled number 3. Accelerator circuits 836 can generate an error code (ECC) from the data, and write such a value back into memory circuits 806. In some embodiments and error code can be written to a same location as its corresponding data value. Such an operation is shown by the bold line designated by the circled number 4. It is understood that an error code can be an error check value, or and error check and correction value. In a very particular embodiment, an error check code can be an SEC-DED type error code.

Figure 10A:
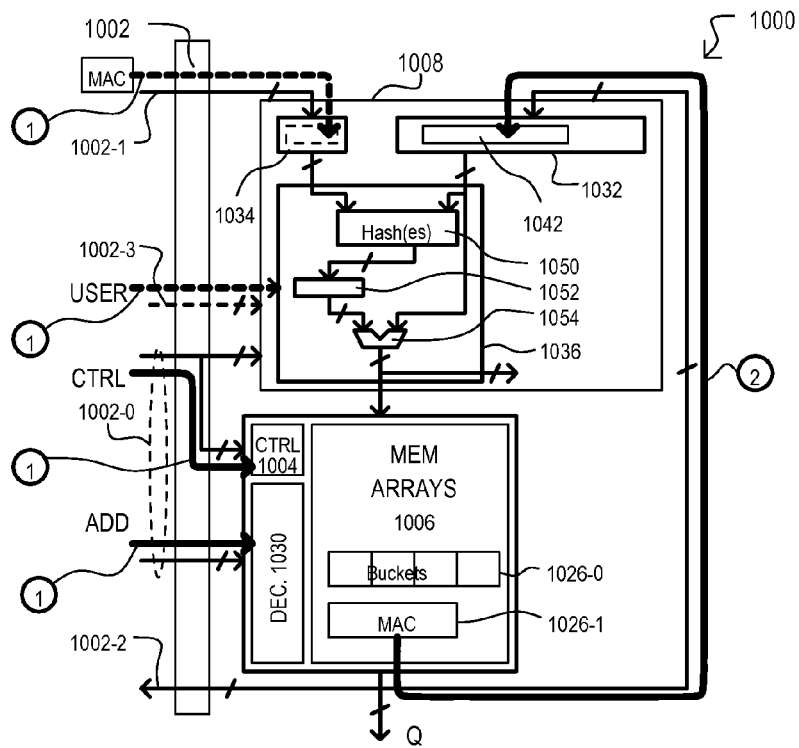
FIGS. 10A to 10E show memory device matching operations using hash functions according to embodiments.
Figure 10B:
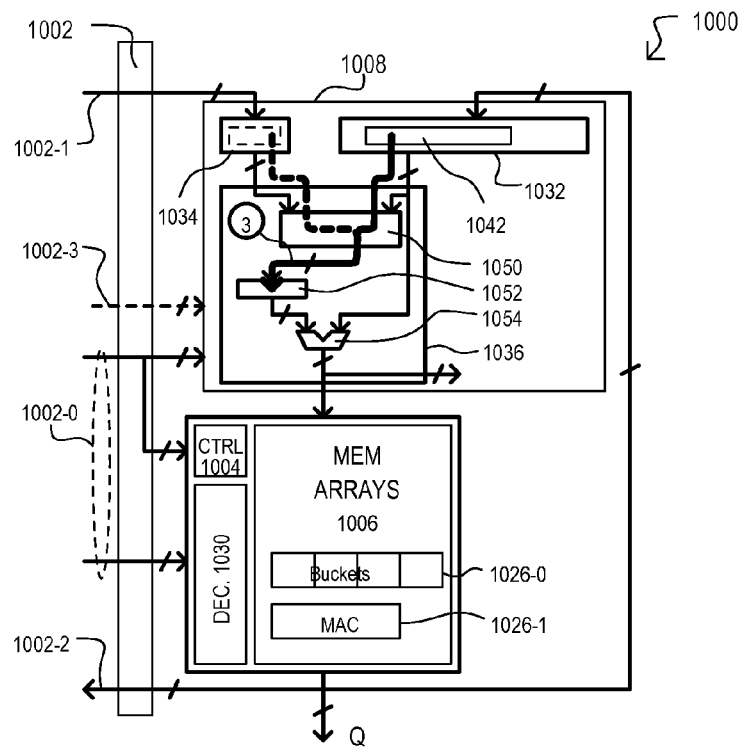

Referring now to FIGS. 10A to 10E, a memory device and operation according to a further embodiment is shown in a series of block schematic diagrams. FIGS. 10A and 10B show an instruction that results in an iterative type operation. The particular embodiment of FIGS. 10A and 10B shows a match function that utilizes a hashing operation. In particular, accelerator circuits can provide a match function for MAC (media access control) value.

A memory device 1000 can include sections those shown in FIGS. 8A and 8B, and like sections are referred to by the same reference character, but with the leading digits being "10" instead of "8".

FIG. 10A shows the reception of instruction data, and the initial response of memory device 1000. In the embodiment shown, accelerator circuits 1036 can include hashing circuits 1050, a latch 1052, and a comparator 1054. Hashing circuits 1050 can perform one or more hash functions on a received input value. A latch 1052 can store a hash function result. A comparator 1054 can compare a hash result with another value.

In response to control/user values (CTRL/USER) and address values (ADD), all or a portion of an addressable data value 1026-1 within memory circuits 1006 can be retrieved as a compare value 1042 and stored in retrieved data latch 1032. As noted above, a retrieved data value can be a MAC address. Such a compare value will be compared against other stored data value. Such actions can occur after the reception control and address data, as shown by the bold line designated by the circled number 2. In addition or alternatively, a compare value (MAC) can be received on data connections 1002-1 and stored in input data latch 1034, as shown by the dashed bold line.

FIG. 10B shows the application of a retrieved data value 1042 (or alternatively, a data value within input data latch 1034) to hashing circuits 1050 to generate a hash result for storage within latch 1052. Such actions are shown by the bold lines designated by the circled number 3. The type of hash function used can be established upon startup of the memory device 1000, in response to control signals CTRL, or in response to user values USER, or combinations thereof.

Results of a hash function operation can be compared to one or more data values (bucket values) stored in a memory device 1000. In one embodiment, bucket values can be stored in memory circuits 1006. Such a configuration is shown in FIGS. 10C and 10D.

Figure 10C:
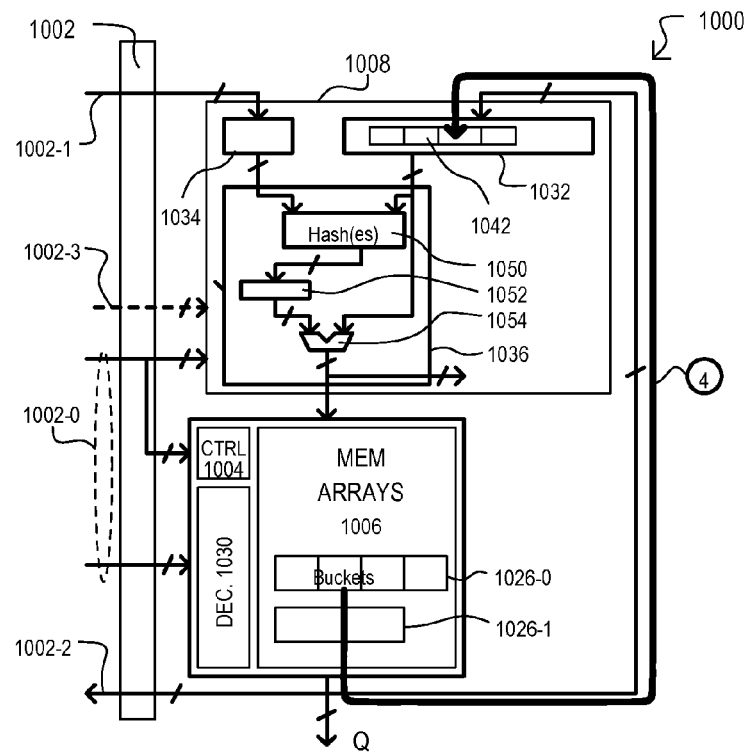

Referring to FIG. 10C, in response to control values (CTRL) and address values (ADD), one or more bucket values 1026-0 can be retrieved from memory circuit within memory circuits 1006 and stored in retrieved data latch 1032. While FIGS. 10C and 10D show four bucket values in an accessed set, embodiments can access fewer or larger numbers of bucket values in a compare operation. Further, such compare operations can be iterative, accessing a next set of bucket values in the event a prior set of bucket values does not yield a match.

Figure 10D:
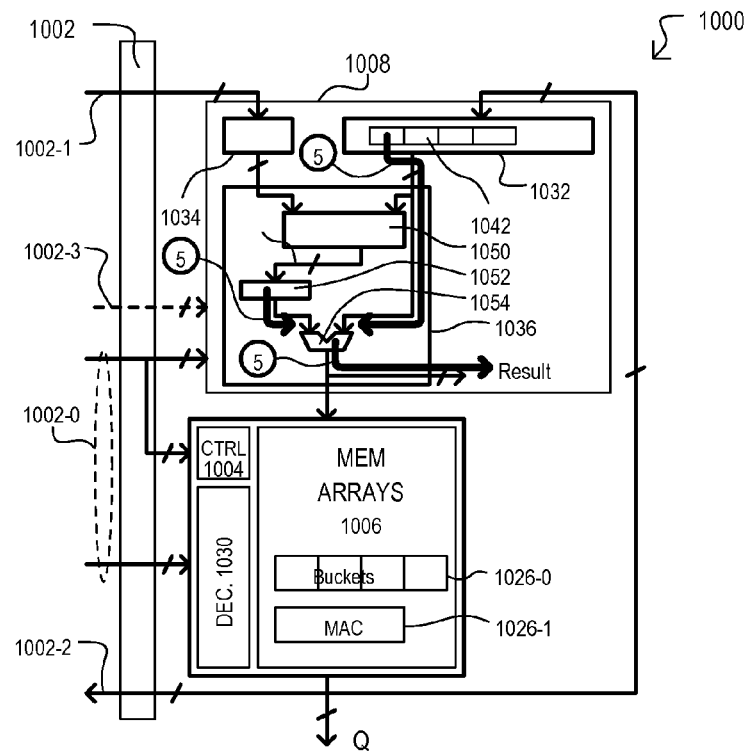

Referring to FIG. 10D, a hash result value stored in latch 1052 can be compared to bucket values within retrieved data latch 1032. Such an operation can be iterative, with one bucket value being compared to a hash result at a time. Alternatively, a comparator 1054 can compare a hash result to multiple bucket values in parallel.

Figure 10E:
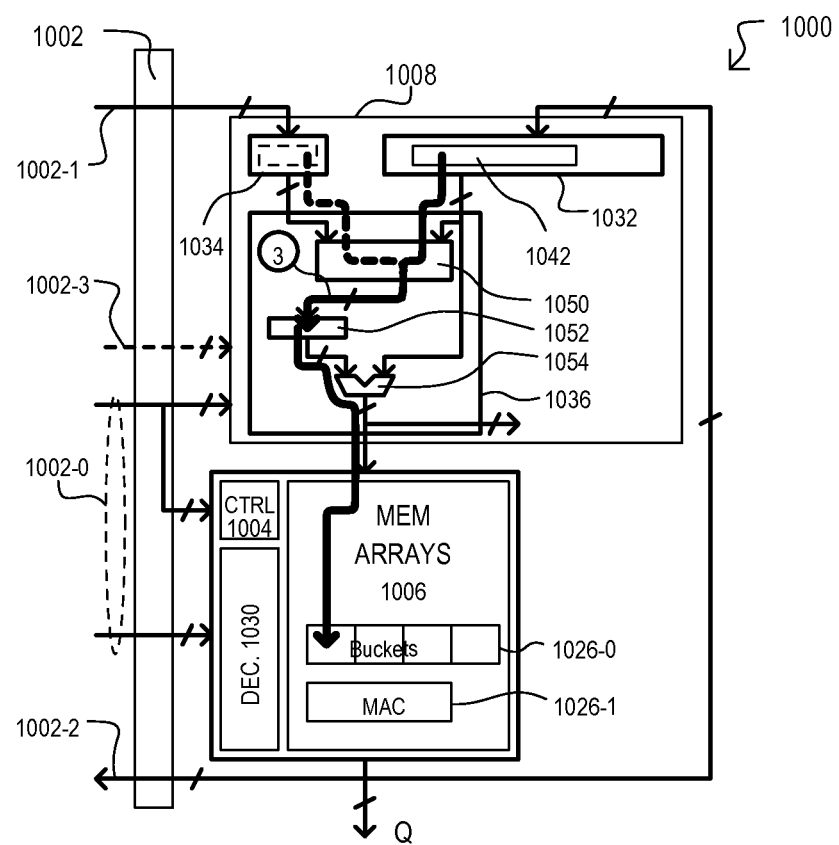

FIG. 10E shows a bucket value generation operation according to an embodiment. Such an operation can precede those shown in FIGS. 10A to 10D, to establish bucket values. FIG. 10E shows the application of a retrieved data value 1042 (or alternatively, a data value within input data latch 1034) to hashing circuits 1050 to generate a hash result. Such a hash result can be stored as a bucket value at addressable location 1026-0 within memory circuits.

Referring now to FIGS. 11A to 11D, a memory device and operations according to embodiments are shown in a series of diagrams. FIGS. 11A to 11D show another iterative operation type in response to received instruction data. Such an operation can be conceptualized as an implementation of a linked-list type traversal. The very particular operation shown can be a trie function.

A memory device 1100 can include sections those shown in FIGS. 8A and 8B, and like sections are referred to by the same reference character, but with the leading digits being "11" instead of "8".

Figure 11A:
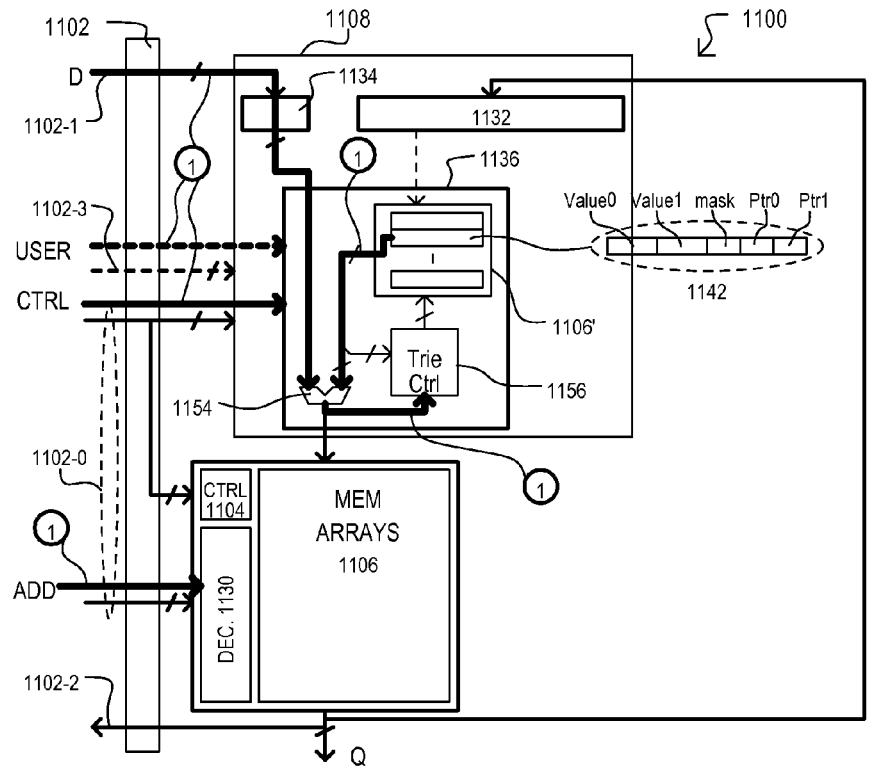
FIGS. 11A to 11G show memory device linked-list traversal operations according to embodiments.

FIG. 11A shows the reception of instruction data and an initial response of memory device 1100-1. In the embodiment shown, accelerator circuits 1136 can include memory circuits 1106', comparator 1154, and a traverse control circuit 1156. Memory circuits 1106' can store a trie data structure, which in the particular embodiment shown, can include retrieved data values (one shown as 1142). In the embodiment shown, each retrieved data value can include two trie values (Value0, Value1), pointer indications for such values (Ptr0, Ptr1), and optionally, a mask value (mask). In one embodiment, memory circuits 1106' can be addressable registers. Data may be written to memory circuits 1106' (e.g., by way of input data connection) and/or data may be loaded into memory circuits 1106' from other memory circuits (e.g., memory arrays 1106). A comparator 1154 can compare trie values (Value0, Value1) to a received data value. Traverse control circuit 1156 can perform a trie operation. In one embodiment, in response to a compare result, a traverse control circuit 1156 can traverse memory circuits 1106' using pointer values (Ptr0, Ptr1).

In response to control/user values (CTRL/USRE) and possibly address values (ADD), initial trie values (e.g., Value0, Value1) can be retrieved from memory circuits 1106' and applied to comparator 1154. A mask value (mask) can mask portions of such trie values. In addition, an input data value received on input data connections 1102-1 can be applied to comparator 1154. In the embodiment shown, such an input data value can be applied through input data latch 1134. Such actions are shown by bold lines identified with a circled 1.

Figure 11B:
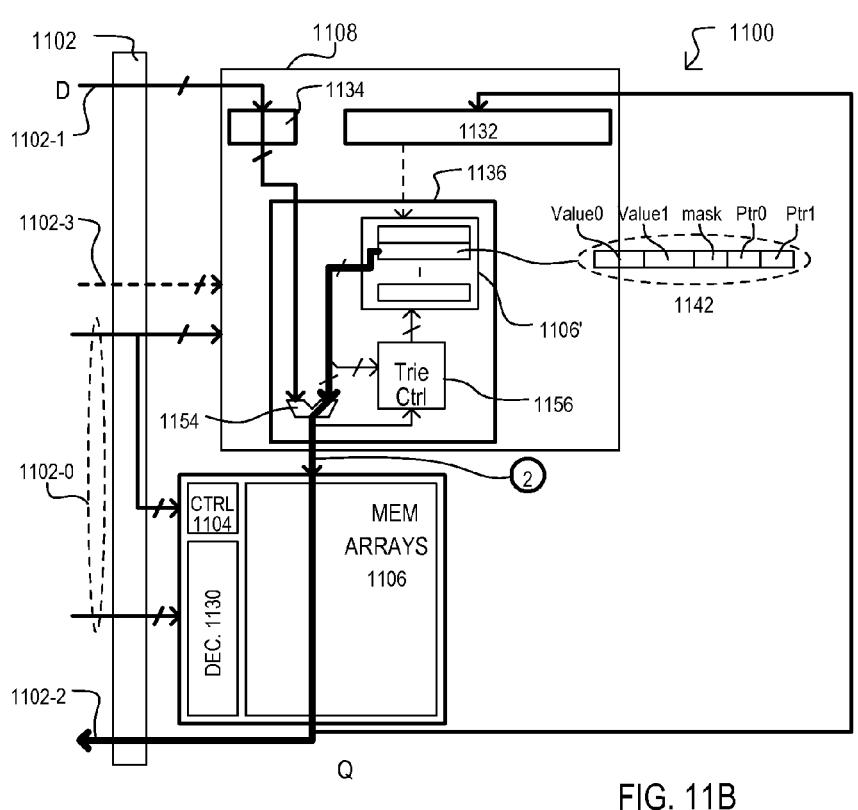

FIG. 11B shows a conclusion of a trie operation. Once a traverse control circuit 1156 has traversed the trie structure within memory circuits 1106' as far as possible (a last match), a last match result can be output. In the embodiment shown, the data can be output on output data connections 1102-2. Such actions are shown by bold lines identified with a circled 2.

While the embodiments of FIGS. 11A and 11B show a memory device that stores a trie data structure in memory circuits separate from memory arrays, other embodiments can access a trie data structure within a memory array. One example of such an embodiment is shown in FIGS. 11C and 11D.

Figure 11C:
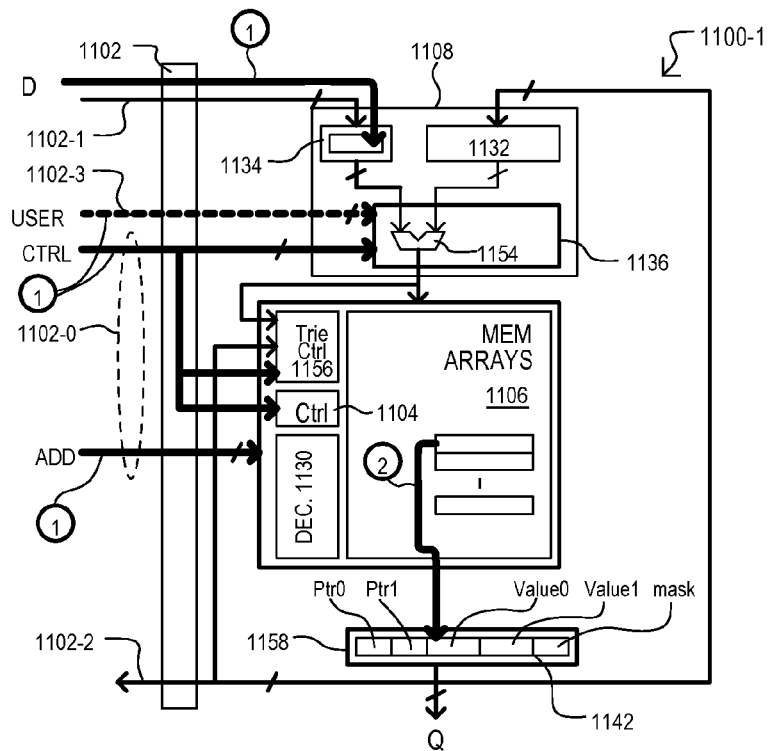
Figure 11D:
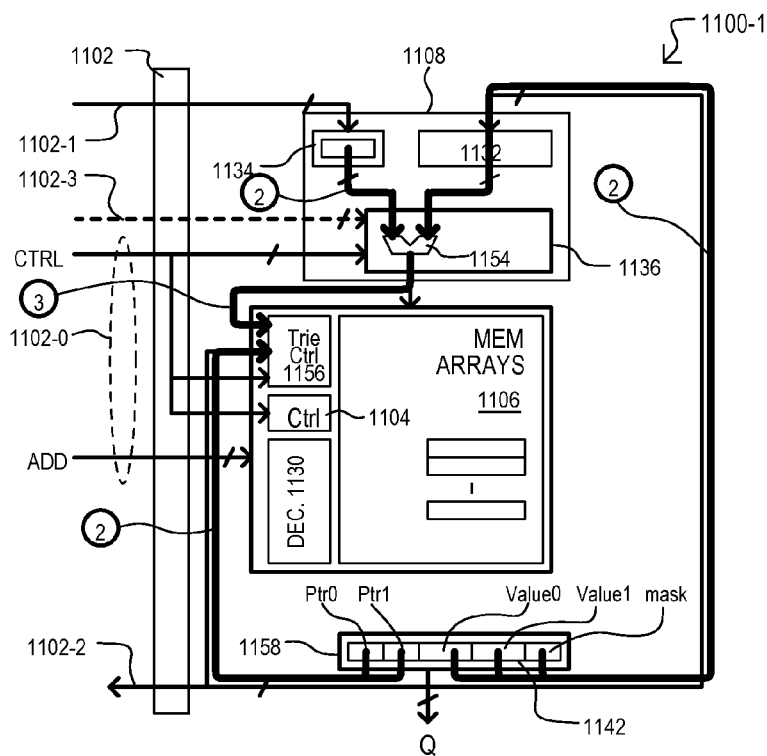

A memory device 1100' of FIGS. 11C and 11D can include sections those shown in FIGS. 11A and 11B, and like sections are referred to by the same reference character.

Referring to FIG. 11C, in the embodiment shown, accelerator circuits 1136 can include a comparator 1154, while a traverse control structure 1156 can exist with control circuits 1104, and can enable accesses to memory circuits 1106 based on compare results. Memory circuits 1106 can include one or more memory cell arrays. Memory circuits 1106 can store a trie data structure, which in particular embodiments, can take the form of that shown in FIGS. 11A and 11B.

In response to control/user values (CTRL/USER) and address values (ADD), initial trie values can be retrieved from memory circuits 1106 and stored in a data register 1158. In the embodiment shown, an input data value can also be received on input data connections 1102-1 and stored within input data latch 1134. Such actions are shown by bold lines identified with a circled 1.

FIG. 11D shows further actions of a trie operation. Retrieved trie values (Value0, Value1) in data register 1158 can be applied to comparator 1154 (along with mask values, if appropriate). An input data value within input data register 1134 can also be applied to comparator 1154. Pointer values (Ptr0, Ptr1) can be provided to traverse control circuit 1156. Such actions are shown by bold lines identified with a circled 2.

Comparator 1154 can compare an input data value to trie values (Value0, Value1), and provide a compare result to traverse control circuit 1156. Based on such a compare result, traverse control circuit 1156 can retrieve another trie value from memory circuits 1106, or can output the last match.

In this way, a memory device can have hardware accelerators for executing a trie function, where a trie data structure can be stored in memory arrays, or in registers separate from a memory array.

Figure 11E:
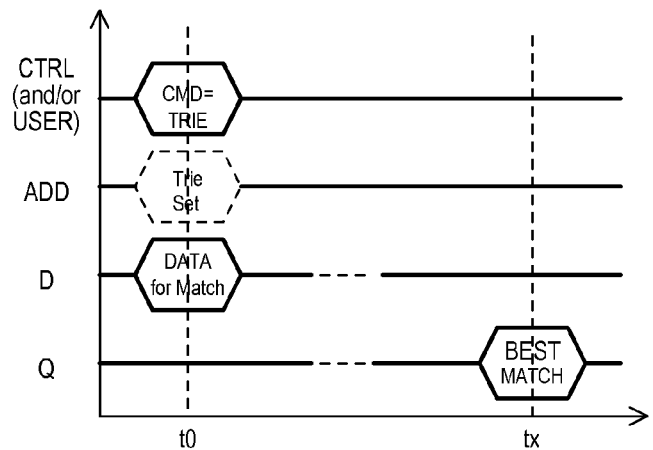

Referring now to FIG. 11E, a timing diagram shows a trie operation according to one very particular embodiment. In the embodiment shown, a trie operation may deliver a result value a set period of time after receipt of a trie instruction. FIG. 11E includes a waveform CTRL (and/or USER), that shows values received on control input connections and/or user connections; waveform ADD, which shows values received on address connections; D which shows data values received on input data connections; and Q which shows data values output on output data connections.

As noted herein, alternatively, a data bus can be bi-directional, in which D and Q values would be combined on a same DQ bus.

At time t0, CTRL (and/or USER) values can signify a trie operation. Optionally, ADD inputs can indicate a trie data structure to access. A data value for application to the trie data structure can be received on an input data bus.

At time tx, a set time following t0, a trie result can be output as value Q. It is noted that even if a traverse controller arrives a trie match (or no match) result prior to time tx, such a result can be withheld until time tx. Thus, time tx can represent a maximum time required to traverse a trie data structure and generate a match result.

Alternatively, a result output within a fixed time can represent a partial traversal of a data structure. That is, a memory device may limit a number of values traversed, and then return a result that indicates whether or not an entire data structure was traversed.

As but one very particular embodiment, a memory device can be configured to traverse a maximum number of items (e.g., four items in a linked-list), and output a result that indicates if the linked-list was followed to an end. If a linked-list could not be fully traversed within the maximum limit (e.g., four steps), an output value can indicate so and/or provide data to enable a follow-on operation to continue down the same linked list (i.e., a pointer to the next item). Such an action can enable a memory device to issue a follow on instruction to resume the traversal of the list starting at the last location.

Figure 11F:
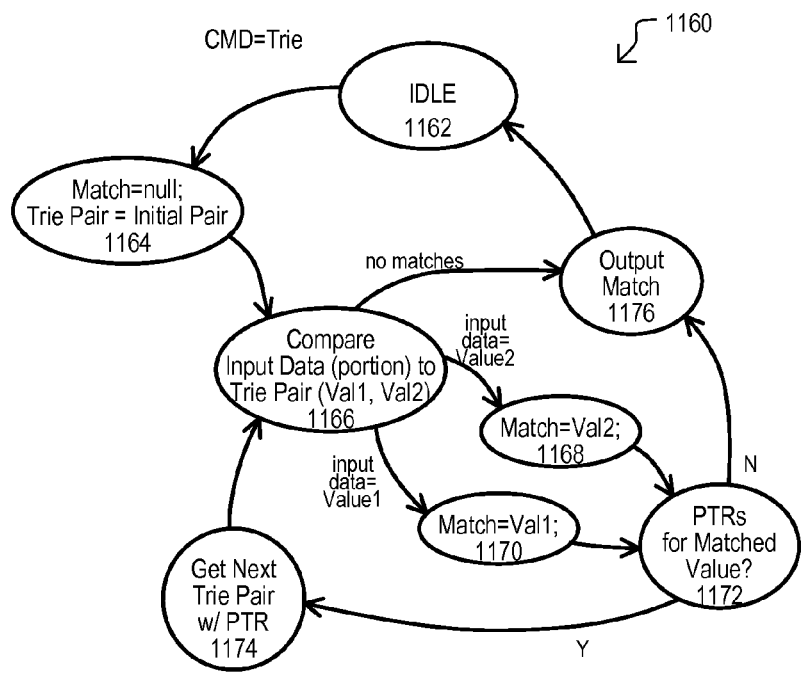

Referring now to FIG. 11F, a traverse control circuit operation 1160 according to an embodiment is shown in a state diagram. Upon receiving a trie function instruction, match values can be set to null values (e.g., no match), and a trie pair can be set to an initial value (1164). Such an action can include retrieving trie data from storage circuits on board a memory device. An input data value (including a portion thereof) can be compared to a current trie pair (1166).

If an input value does not match any trie value (no matches), a current match value can be output (1176) (which can be a no match value). If an input value matches a trie value (input data=Value2 or input data=Value1), a match value can be set to the trie value (1168) or (1170). A trie data value can be checked to determine if a pointer existed for such a data value (1172). A pointer can indicate further traversal of the trie data structure. If a pointer exists, a next trie pair can be retrieved (1174) and a traverse control circuit can return to state (1166). If a pointer does not exist, a traverse control circuit can go to state (1176).

Trie operations as described above can be used for various progressive match functions. However, in a very particular embodiment, a memory device can be network memory device and a trie structure can provide longest prefix matching and/or packet classification functions.

Figure 11G:
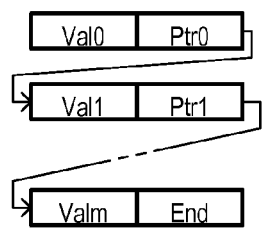

FIG. 11G shows a linked-list structure according to one embodiment. Accelerator circuits (e.g., 1136) can traverse such a structure based on pointers associated with each value. Such a traversal can be conditional (i.e., following pointer based on some result) or unconditional (follow pointer automatically).

It is understood that an iterative type operation, as described above, can utilize data structures beyond a linked list or trie data structure. As but one example, an operation could perform iterative actions on an index table structure.

Referring now to FIGS. 12A to 12I, a memory device and operations according to further embodiments are shown in a series of diagrams. FIGS. 12A to 12I show how received instruction data can result in an indirect access of storage locations. In particular, FIGS. 12A to 12I show data packet queuing and de-queuing functions.

A memory device 1200 can include sections those shown in FIGS. 8A and 8B, and like sections are referred to by the same reference character, but with the leading digits being "12" instead of "8".

Figure 12A:
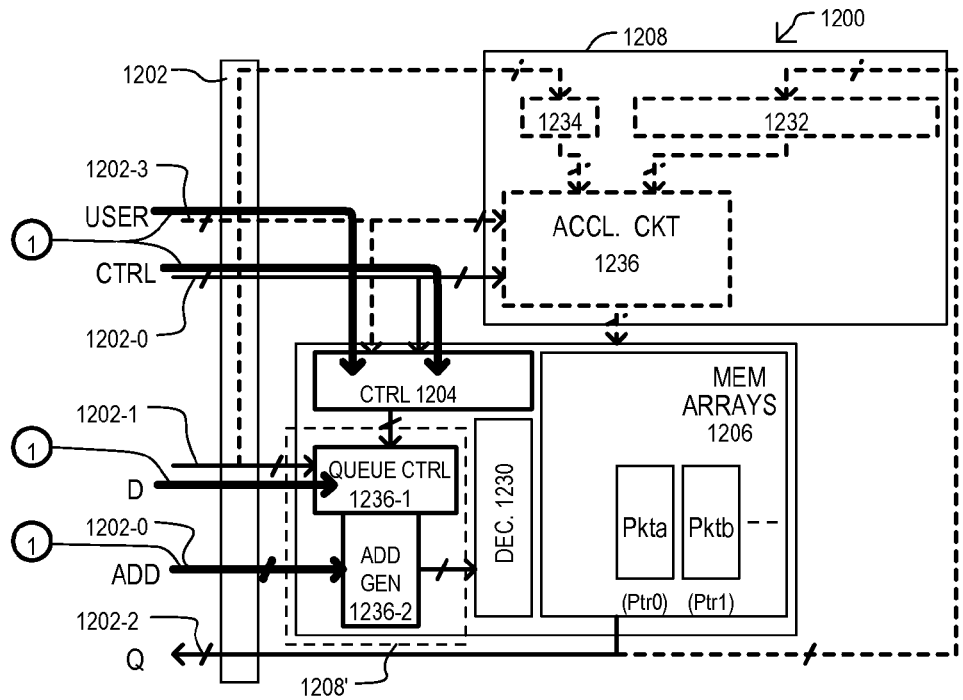

FIG. 12A shows the reception of instruction data, and the initial response of memory device 1200. In the embodiment shown, an accelerator section 1208' can include queue control circuit 1236-1 and an address generator 1236-2. Queue control circuit 1236-1 can provide an "indirect" memory access. In response to a packet ID, queue control circuit 1236-1 can enable address generator 1236-2 to generate a sequence of physical addresses that enable a packet to be queued within storage circuits 1206 of memory device 1200. Optionally, a memory device 1200 can include an additional accelerator section 1208, like any of those described in embodiments above, or equivalents.

In response to control/user values (CTRL/USER) and, optionally, address values (ADD), control circuits 1204 can indicate to queue control circuit 1236-1 that a queue instruction has been received. In the embodiment shown, queue control circuit 1236-1 can receive a data value that can identify a packet for queuing. In some embodiments, such data may also include packet information (e.g., byte size of the packet, quality of service (QOS), or the other packet data). In response to such data, queue control circuits 1236-1 can establish an address space within memory circuits 1206 to store an incoming packet. Such actions are shown by bold lines identified with a circled 1.

Figure 12B:
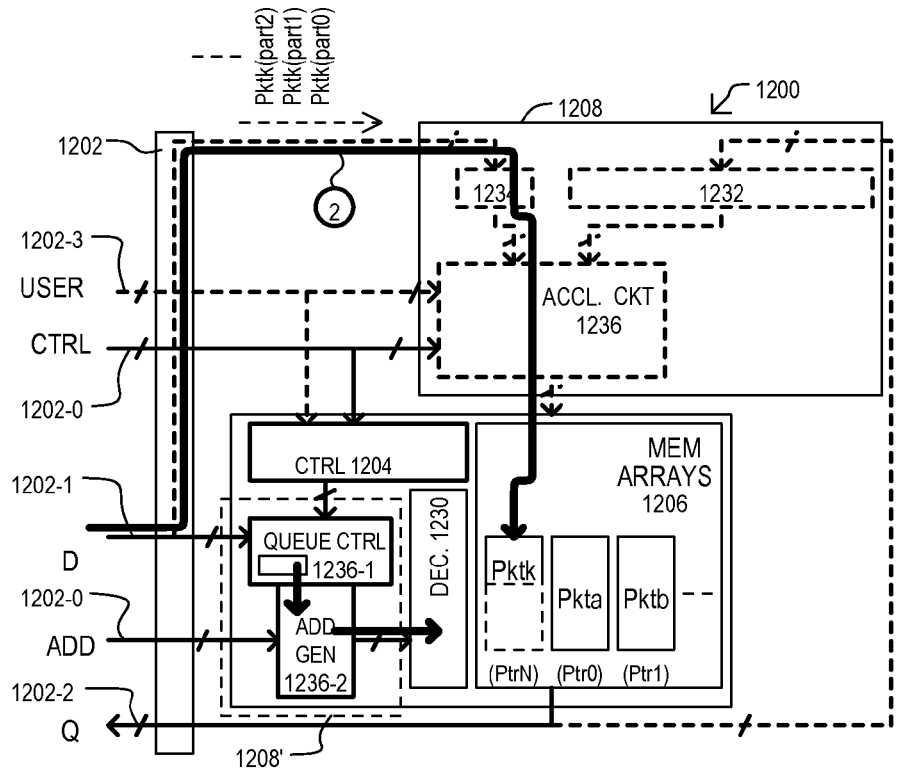

FIG. 12B shows the reception and storing of data for a packet "Pktk". In the embodiment shown, packet data (shown as Pktk(part0)/Pktk(part1)/Pktk(part2) . . . ) can be received on data connections 1202-1. In conjunction with the receipt of such packet data, queue control circuit 1236-1 in combination with address generator 1236-2 can generate physical addresses to store the packet data at predetermined locations. Packet data can include a source address and a destination address for the packet, and optionally, payload data for the packet.

FIG. 12C shows a table that can be included in a queue control circuit 1236-1, according to one particular embodiment. A table can have locations be addressable by a packet ID value (Packet ID). Locations can include information for a queued packet. In the particular embodiment shown, such packet data can include packet location data (Packet Location) and a status data (Status). Packet location data can indicate physical address occupied by the corresponding packet. It is noted that packet location values can take various other forms, such as a starting address and size, as but one example. A status value can be used to identify free entries in the table. That is, when a packet is queued, its corresponding entry can be valid (V). However, once a packet is de-queued, its valid status can be changed to invalid. A queue control circuit 1236-1 can create an entry for a packet as it is received and queued. It is understood that a table could include various other packet data, including quality-of-service (QOS) values. In a very a particular embodiment, FIG. 12C can be implemented as a translation look aside buffer (TLB).

FIG. 12D is a timing diagram showing a packet queuing operation according to one embodiment. FIG. 12D includes the same waveforms as FIG. 11E. As in the case of FIG. 11E, a data bus can be bi-directional, in which D and Q values would be combined on a same DQ bus.

At time t0, CTRL (and/or USER) values can signify a queue packet operation. Packet information can be received on address connections and/or input data connections. In response to such values, a queue controller can create a queue entry for the incoming packet and prepare to write data for the packet into memory circuits.

From time t1 to t(n−1), packet data can arrive on input data connections, and can be written to locations established by a queue controller.

Optionally, at time tn, a memory device can return an acknowledgement (ACK) to a device issuing the packet queuing command that can indicate whether or not the packet has been successfully queued. In one embodiment, such an acknowledgement can be returned on output data connections.

Referring now to FIG. 12E, a queue control circuit operation 1278 according to an embodiment is shown in a state diagram. Upon receiving a queue packet command (CMD=Queue Packet), a pointer value can be generated (1282). A pointer value can link a logical ID of a packet with physical addresses in a memory device. Data packet can then be written into memory device locations (1284). If a packet is not completely written, an error can be generated (1288), and a queue controller can then return to an idle state (1280). If a packet is completely written, a pointer table can be updated (1286). Such an action can include storing data corresponding to a packet ID, as described above, and equivalents. An acknowledgement can then be generated (1290), and a queue controller can return to an idle state (1280).

Figure 12F:
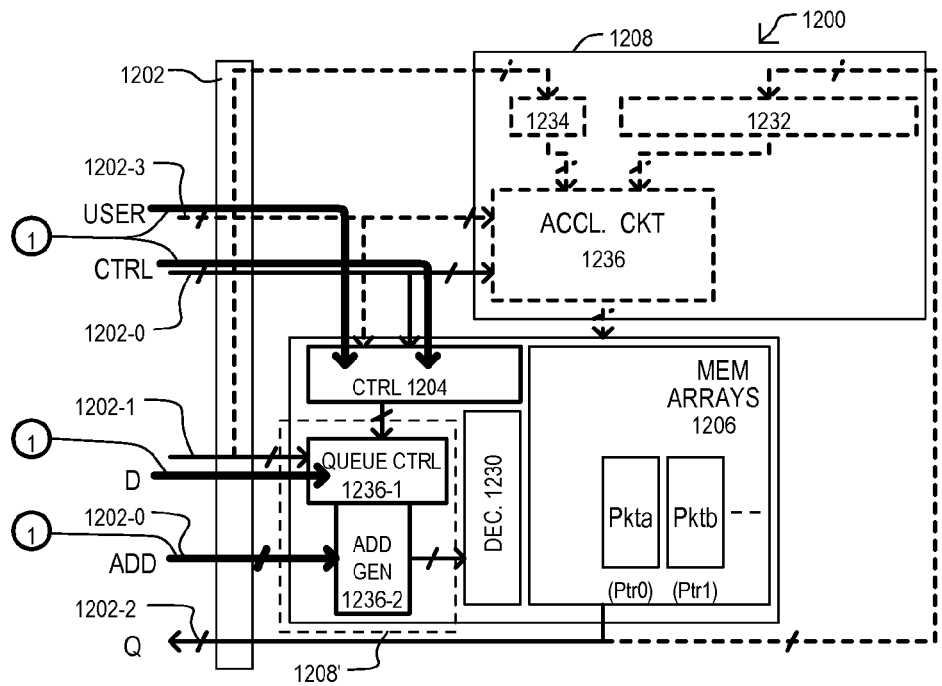

FIG. 12F shows a de-queue operation for memory device 1200. FIG. 12F shows a same operation as FIG. 12A, except that in response to control/USER values (CTRL/USER) and optionally address values (ADD), control circuits 1204 can indicate to queue control circuit 1236-1 that a de-queue instruction has been received.

Figure 12G:
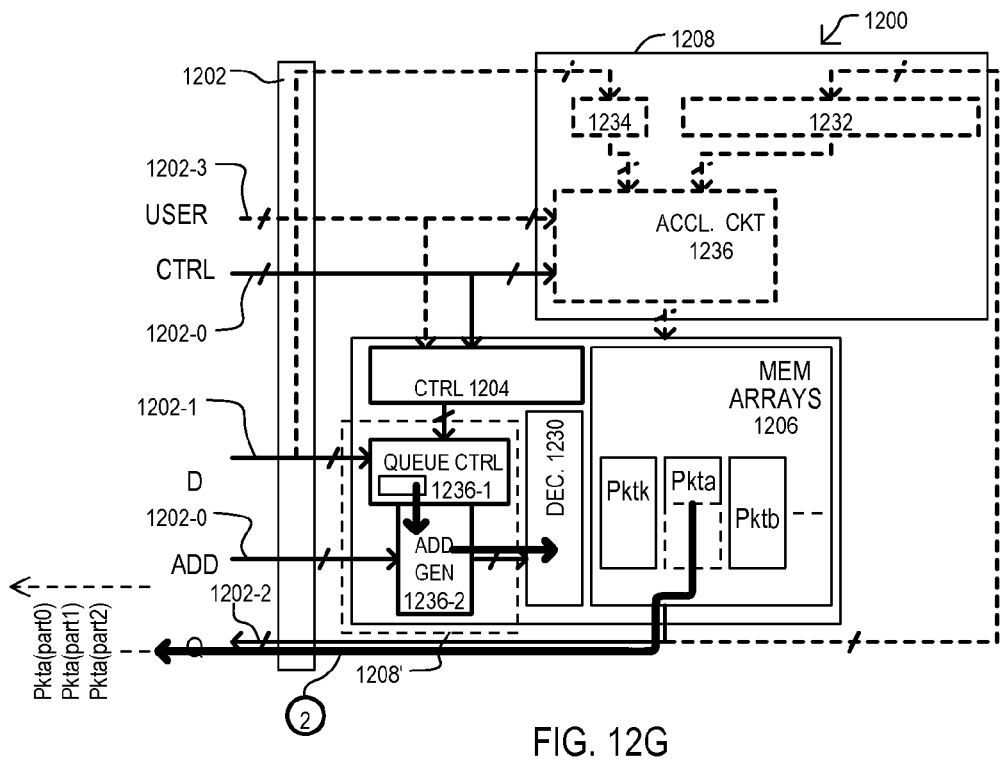

FIG. 12G shows the output of data for a packet "Pkta" (shown as Pkta(part0)/Pkta(part1)/Pkta(part2) . . . ). In response to a packet identification value, queue control circuit 1236-1 in combination with address generator 1236-2 can generate physical addresses to access packet data for output on output data connections 1202-2.

Figure 12H:
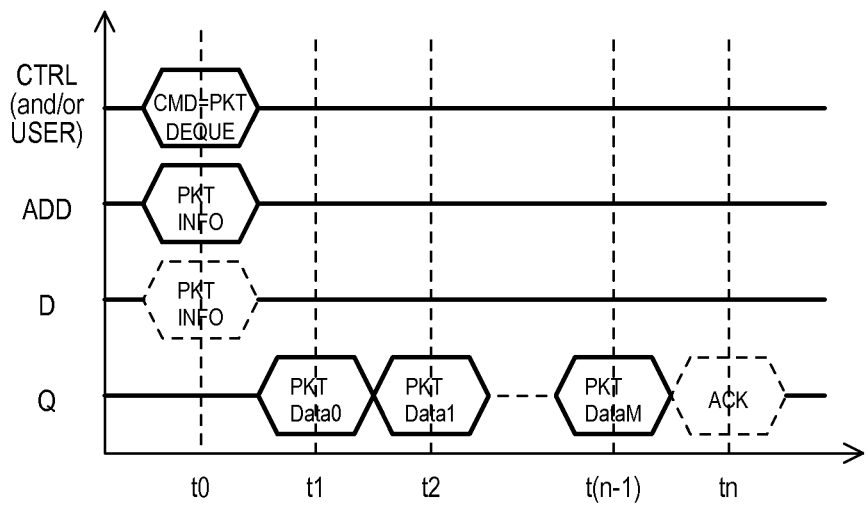
Figure 12I:
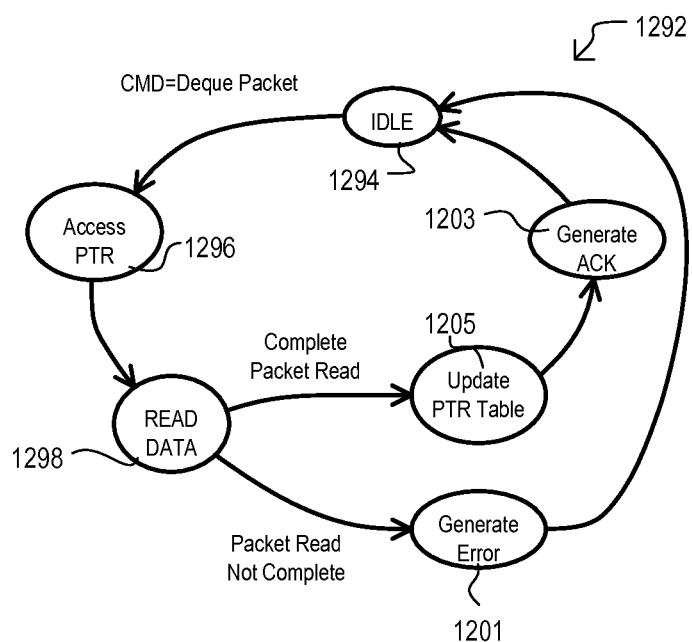

FIG. 12H is a timing diagram showing a packet de-queuing operation according to one embodiment. FIG. 12H includes the same waveforms as FIG. 11E. As in the case of FIG. 11E, alternatively, a data bus can be bi-directional, in which D and Q values would be combined on a same DQ bus.

At time t0, CTRL (and/or USER) values can signify a de-queue packet operation. Packet information can be received on address connections and/or input data connections. In response to such values, a queue controller can prepare to read data for the packet.

From time t1 to t(n−1), packet data can be output on output data connections.

Optionally, at time tn, a memory device can return an acknowledgement (ACK) indicating whether or not the packet has been successfully de-queued. In one embodiment, such an acknowledgement can be returned on output data connections.

Memory devices as described herein can take various forms. However, in particular embodiments, memory devices can be compatible with existing memory device interfaces. One such embodiment is shown in FIG. 13A.

Figures 13A, 13B:
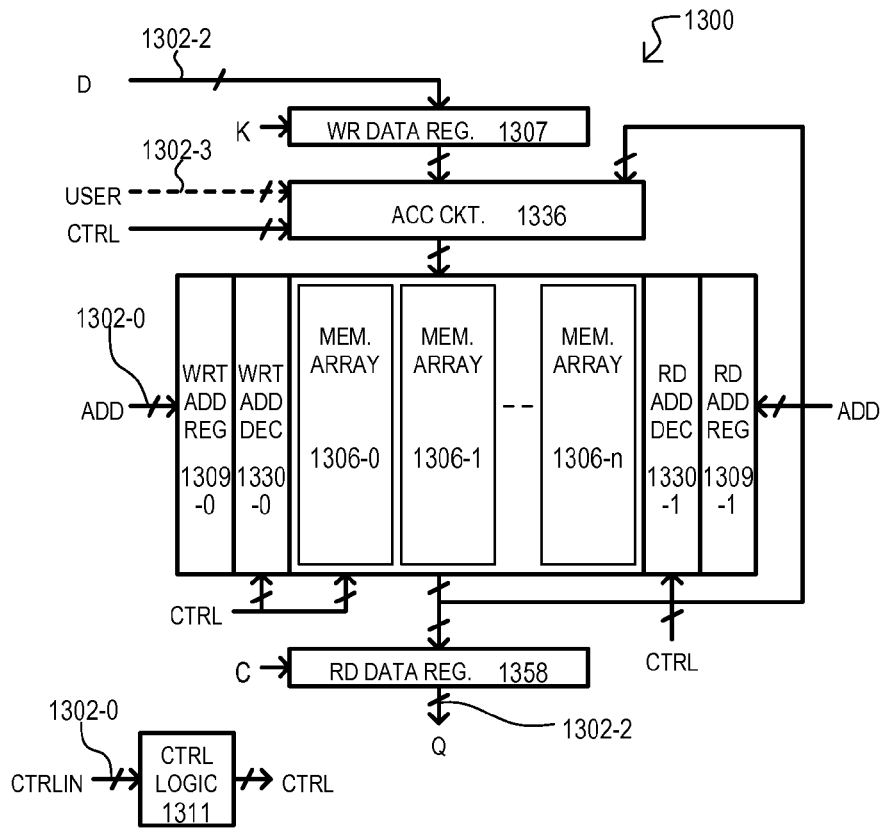
FIG. 13A shows a quad data rate compatible memory device according to an embodiment.
FIG. 13B shows memory device command formats according to one embodiment.

FIG. 13A shows a memory device 1300 that can be compatible with a quad data rate (QDR) type memory device, such as those provided by Cypress Semiconductor Corporation of San Jose, Calif. U.S.A.

In the embodiment of FIG. 13A, a memory device 1300 can include items like those of other embodiments, and such like items are referred to by the same reference character but with the leading digits being "13".

A memory device 1300 can also include a write address register 1309-0, a write address decoder 1330-0, a read address register 1390-1, a read address decoder 1330-1, a read data register 1358, and a write data register 1307. Write and read address registers 1309-0/1 can latch received addresses on falling and rising edges of a timing clock K. Write address register 1390-0 can latch write data on input data connections 1302-2, also on falling and rising edges of clock K. Read data register 1358 can provide output data on falling and rising edges of a data clock C.

Data can be stored in any of multiple memory cell arrays 1306-0 to -n. Memory cell arrays (1306-0 to -n) can be formed from any suitable memory cells, including but not limited to static random access memory (SRAM) cells or dynamic RAM (DRAM) cells.

Control logic 1311 can generate control signals for various sections of memory device 1300 in response to received control values CTRLIN.

Accelerator circuits 1336 can perform accelerator operations as described in embodiments herein, and equivalents. Thus, a memory device 1300, in addition to standard QDR read and write operations, can also perform special operations.

FIG. 13B is a table showing an instruction format for a memory device according to an embodiment. As shown, in response to standard control values/RPS and/WPS conventional read (READ) and write (WRITE) operations can be performed. However, USER values (User0 to User2) in combination with standard control values (/RPS and /WPS) can designate special operations executable by a memory device. In the embodiment shown, such special operations can include update operations (UPDATE VALUE), which can alter all or selected fields of an addressable data value with or without an operand according to one or more arithmetic/logic operations; increment/decrement operations (INC/DEC VALUE), which can increment or decrement all or selected fields of an addressable data value by a predetermined amount; error check/corrections operations (ERROR CHECK), which can perform an error check and/or correction on an addressable data value (or portion thereof); an error code generation operation (ECC GENERATION), which can generate an error check and/or error correction code for an addressable data value (or portion thereof); a matching operation with a hash function (HASH MATCH), which can compare a received value to stored "bucket" values based on one or more hashing functions; trie operations (TRIE), which can traverse one or more stored trie data structures with a received data value; a packet queuing operation (PACKET QUEUE), which can queue a packet within storage locations of the memory device; and a packet de-queuing operation (PACKET DE-QUEUE), which can de-queue a packet from within storage locations of the memory device.

It is understood that FIG. 13B is but one embodiment. Other embodiments can provide a smaller or larger number of special operations and/or provide special operations different from those listed.

Figures 14A, 14B:
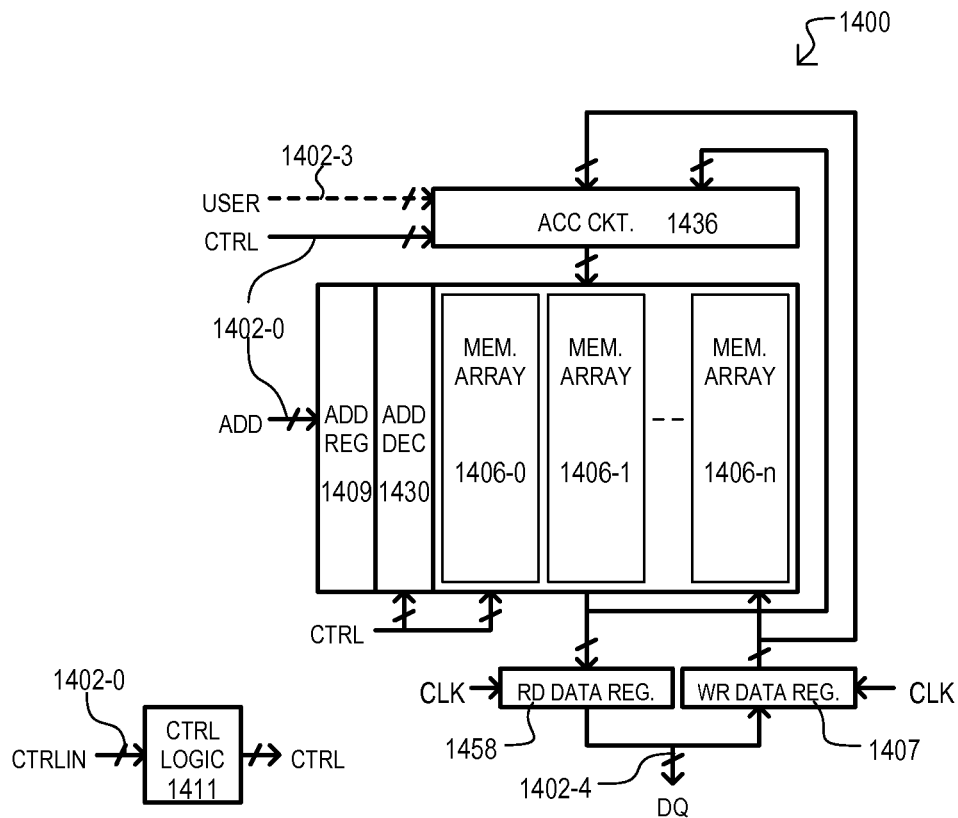
FIG. 14A shows a dynamic random access memory compatible memory device according to an embodiment.
FIG. 14B shows memory device command formats according to another embodiment.

A memory device compatible with another interface is shown in FIG. 14A.

FIG. 14A shows a memory device 1400 that can be compatible with a double data rate DRAM type standard.

In the embodiment of FIG. 14A, a memory device 1400 can include items like those of FIG. 13A, and such like items are referred to by the same reference character but with the leading digits being "14".

A memory device 1400 can differ from that of FIG. 13A in that it can include a bi-directional data connections 1402-4, as does not include separate read and write address registers and decoders. Data can be read and written on such data connections on rising and falling edges of a timing clock (CLK).

Data can be stored in any of multiple memory cell arrays 1406-0 to -n. Memory cell arrays (1406-0 to -n) can be formed from any suitable memory cells, including but not limited to static random access memory (SRAM) cells or dynamic RAM (DRAM) cells.

Control logic 1411 can generate control signals for various sections of memory device 1400 in response to received control values CTRLIN.

Accelerator circuits 1436 can perform accelerator operations as described in embodiments herein, and equivalents. Thus, a memory device 1400, in addition to standard read and write operations, can also perform special operations.

FIG. 14B is a table showing an instruction format for a memory device according to an embodiment. As shown, in response to standard control values/CAS, /RAS and /WE, conventional read and write operations can be performed. However, additional command address values (CA3 to CA5) in combination with standard control values (/CAS, /RAS, /WE) can designate additional operations executable by a memory device. FIG. 14B shows the same special operations as FIG. 13B.

As in the case of FIG. 13B, FIG. 14B is but one embodiment, and other embodiments can provide a smaller or larger number of special operations and/or provide special operations different from those listed.

FIG. 15 is a table showing an instruction format for a memory device according to a further embodiment. In FIG. 15, a portion of address can dictate a type of special operation performed. As shown, for one address space (i.e., A20=A19=A18=0), standard operations can be performed (e.g., read or write). However, accesses to other portions of an address space can result in a special operation being performed. In the very particular embodiment shown, such special operations can include those selected by a user and with a user provided operand (A20=1, A19=A18=0); special preset operations without operands (operations established upon start-up of the memory device) (A20=1, A19=0, A18=1); special preset operations with preset operands (A20=A19=1, A18=0); special preset operations with externally provided operands (A20=A19=A18=1); and special operations that do not utilize an address value.

As in the case of FIG. 15, and other embodiments can provide a smaller or larger number of special operations and/or provide special operations different from those listed. From FIG. 15, it is understood that embodiments shown above can include variants in which special operations need not be determined by CTRL and/or USER inputs, but can be selected by address values.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory device, comprising:
an interface comprising a plurality of control connections and address connections and at least one set of data connections;
memory circuits comprising a plurality of storage locations randomly accessible for read and write operations in response to at least an address value received from the address connections; and
accelerator circuits coupled directly to the memory circuits and configured to receive input data directly from the data connections of the interface and perform at least one determined operation on at least one of the input data or data stored in the memory device to generate modified data for storage within the memory circuits in response to at least one command received directly from the control connections on the interface, wherein the modified data is output directly from the memory circuits on the data connections of the interface,
wherein the at least one command is supplemental to the read and write commands executable by the memory device.

2. The memory device of claim 1, wherein:
the interface, memory circuits and accelerator circuits are formed in a same integrated circuit package.

3. The memory device of claim 1, wherein:
the interface, memory circuits and accelerator circuits are formed in a same integrated circuit substrate.

4. The memory device of claim 1, wherein:
the memory device comprises a memory module having a circuit board;
the interface comprises memory module leads;
the memory circuits comprise a plurality of memory integrated circuits; and
the accelerator circuits are coupled to the plurality of memory integrated circuits.

5. The memory device of claim 1, wherein:
the accelerator circuits comprise at least one arithmetic/logic circuit configured to perform at least one arithmetic/logic operation on at least a portion of a data value in a storage location.

6. The memory device of claim 5, wherein:
the data stored in the memory circuits is logically divided into fields; and
the accelerator circuits comprise a field selector circuit to selectively couple a subset of the fields of stored data values for application to arithmetic logic circuits.

7. The memory device of claim 1 wherein,
the at least one command comprises a value update command, and wherein
the accelerator circuits comprise the at least one arithmetic-logic circuit configured to add at least a portion of the input data value received directly from the data connections to at least a portion of the stored data value to generate the modified data; and wherein the memory device further comprises:
control circuits to write the modified data value to the memory circuits.

8. The memory device of claim 1 wherein,
the at least one command comprises an error check command;
at least some of the data stored in the memory circuits comprises a data portion and an error code corresponding to the data portion, and wherein
the accelerator circuits comprise the at least one error detection circuit configured to execute at least an error check operation on a stored data value with the data portion and error code portion.

9. The memory device of claim 1 wherein,
the at least one command comprises a match function command;
the accelerator circuits comprise at least one hash function circuit having a hash input coupled to receive at least a portion of the stored data value and a hash output;
a comparator circuit having a first input coupled to the hash output and a second input coupled to receive other stored data values, and a comparator output; and wherein the memory device further comprises:
control circuits to generate a result output value in response to the comparator output.

10. The memory device of claim 1 wherein,
the at least one command comprises a linked-list traverse command;
the memory circuits comprises a linked-list store; and
the accelerator circuits comprise a traverse controller configured to traverse items in a linked list in response to the linked-list traverse command.

11. A method, comprising:
in response to a read or write command and address received from a first interface, accessing storage locations of at least one memory device; and
in response to at least one special command, supplemental to the read or write commands, and received, at least in part, directly from the first interface as the read or write commands, performing at least one determined operation on at least one of input operands received directly from the first interface or data stored in the memory device to generate modified data for storage within memory circuits coupled directly to accelerator circuits formed in the memory device, wherein the modified data is output directly from the memory circuits on the first interface.

12. The method of claim 11, wherein performing at least one determined operation comprises:
receiving input operands directly from the first interface;
retrieving a data value stored in the memory circuits;
modifying the data value to generate a modified data value; and
writing the modified data value into the memory circuits.

13. The method of claim 11, wherein:
modifying the data value comprises performing an arithmetic-logic function on at least a portion of the retrieved data value with at least one of the input operands received directly from the first interface with the at least one special command.

14. The method of claim 11, wherein performing at least one determined operation comprises:
retrieving a data value stored in the memory circuits; and
performing at least error detection on the retrieved value with an error code.

15. The method of claim 11, wherein performing at least one determined operation comprises:
performing a hash function on at least a portion of retrieved value to generate a modified value; and
comparing the modified value to a plurality of bucket values stored in the memory device.

16. The method of claim 11, wherein:
performing at least one determined operation comprises performing a linked-list traversal on a linked-list data structure stored in the memory device.

17. The method of claim 11, wherein:
performing at least one determined operation further comprises storing a network data packet in the memory circuits in response to at least one special packet queue command received on the interface.

18. A memory device, comprising:

an interface comprising a plurality of control connections and address connections and at least one set of input data connections and output data connections;

a plurality of memory circuits each comprising a plurality of storage locations randomly accessible for read and write operations in response to at least an address value received on the address connections; and an accelerator circuit directly coupled to each of the memory circuits and configured to receive input data directly from the interface and perform at least one determined operation on at least one of the input data or data stored in the memory device to generate modified data for storage within the plurality of memory circuits in response to at least one command received from the control connections on the interface, wherein the modified data is output from the memory circuits directly on the output data connections of the interface, wherein the at least one command is supplemental to read and write commands executable by the memory device.

19. The memory device of claim 1, wherein the accelerator circuit to execute the at least one determined operation on data on the memory locations within at least one memory circuits individually or collectively.

\* \* \* \* \*